United States Patent [19]
Tanner

[11] 4,295,218
[45] Oct. 13, 1981

[54] ERROR-CORRECTING CODING SYSTEM

[75] Inventor: Robert M. Tanner, Capitola, Calif.

[73] Assignee: Regents of the University of California, Berkeley, Calif.

[21] Appl. No.: 51,416

[22] Filed: Jun. 25, 1979

[51] Int. Cl.³ .......... G06F 11/10
[52] U.S. Cl. .......... 371/40; 371/45
[58] Field of Search .......... 371/37, 40, 43, 45

[56] References Cited

U.S. PATENT DOCUMENTS

| | | | |
|---|---|---|---|
| 3,538,497 | 11/1970 | Harmon | 371/43 |
| 3,542,756 | 11/1970 | Gallager | 371/40 |
| 3,648,236 | 3/1972 | Burton | 371/37 |
| 3,665,396 | 5/1972 | Forney, Jr. | 371/43 |
| 3,781,791 | 2/1973 | Sullivan | 371/37 |
| 3,818,442 | 6/1974 | Solomon | 371/37 |
| 4,099,160 | 7/1978 | Flagg | 371/37 |

OTHER PUBLICATIONS

Lee, Concatenated Coding Systems Employing a Unit-Memory Convolutional Code and a Byte-Oriented Decoding Algorithm, IEEE Transactions on Communications, vol. Com-25, No. 10, Oct. 1977, pp. 1064-1074.

Rudolph and Hartmann, IEEE Transaction on Information Theory, Decoding by Sequential Code Reduction, vol. IT-19, No. 4, Jul. 1973, pp. 549-555.

*Primary Examiner*—Charles E. Atkinson
*Attorney, Agent, or Firm*—Poms, Smith, Lande & Rose

[57] ABSTRACT

A method and apparatus for constructing long error-correcting codes from one or more shorter error-correcting codes, referred to as subcodes, and a bipartite graph. The graph specifies carefully chosen subsets of the digits of the new codes that must be codewords in one of the shorter subcodes. Lower bounds on the rate and the minimum distance of the new code are derived in terms of the parameters of the graph and the subcodes. Both the encoders and decoders employed take advantage of the code's explicit decomposition into subcodes to decompose and simplify the associated computational processes. Bounds on the performance of two specific decoding algorithms are established, and the asymptotic growth of the complexity of decoding for two types of codes and decoders is analyzed. The decoders are able to make effective use of probabilistic information supplied by the channel receiver, such as reliability information, without greatly increasing the number of computations required. By a chosen transmission order for the digits that is appropriate for the graph and the subcodes, the code has excellent burst-error correction abilities.

10 Claims, 39 Drawing Figures

BIT NUMBER 1 2 3 4 5 6 7
$$H = \begin{bmatrix} 1 & 0 & 0 & 1 & 0 & 1 & 1 \\ 0 & 1 & 0 & 1 & 1 & 1 & 0 \\ 0 & 0 & 1 & 0 & 1 & 1 & 1 \end{bmatrix} \begin{matrix} \leftarrow \text{SUBCODE 1} \\ \leftarrow \text{SUBCODE 2} \\ \leftarrow \text{SUBCODE 3} \end{matrix}$$
WHERE: N−K=3 AND N=7
FIG 7
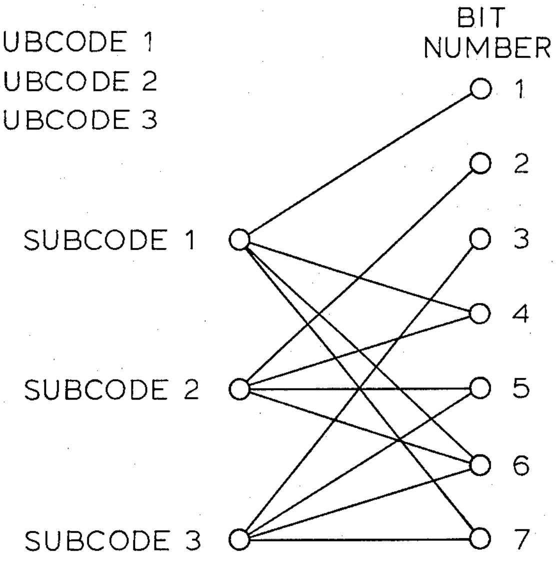
FIG 8
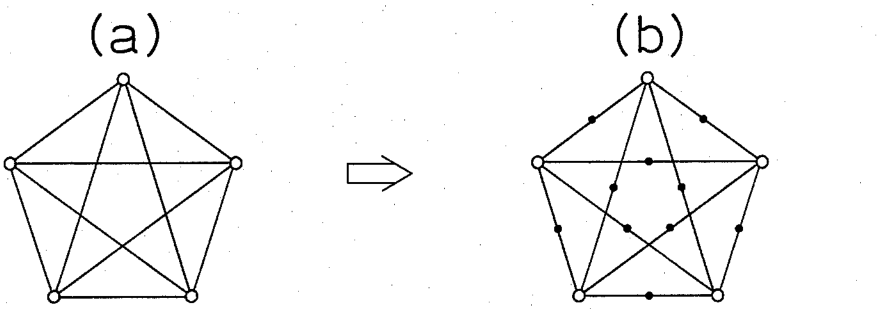
5 NODES
DIAMETER 1
GIRTH 3
5 SUBCODE NODES
10 DIGIT NODES $\binom{5}{2} = \frac{5!}{2!3!}$
DIAMETER 4, GIRTH 6
FIG 9
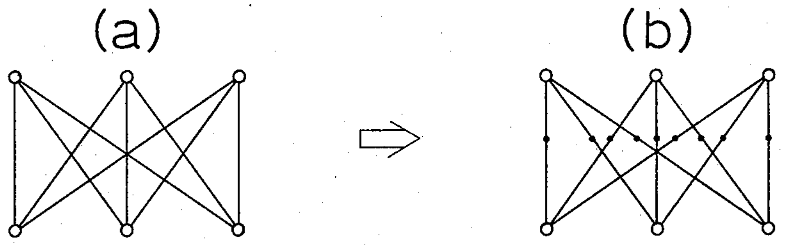
DIAMETER 2
GIRTH 4
3 SUBCODE NODES
9 DIGIT NODES
DIAMETER 4, GIRTH 8
FIG 10

COMPLETE GRAPH ON 11 NODES
11 SUBCODE NODES EACH
CHECKING 10 BITS
$\binom{11}{2}$ = 55 BITS THE SUBCODE: A COMPLETE
GRAPH ON 5 NODES 5 PARITY
CHECKS EACH CHECKING 4 BITS
A [10,6,3] CODE

A [55,11,18] RECURSIVE CODE

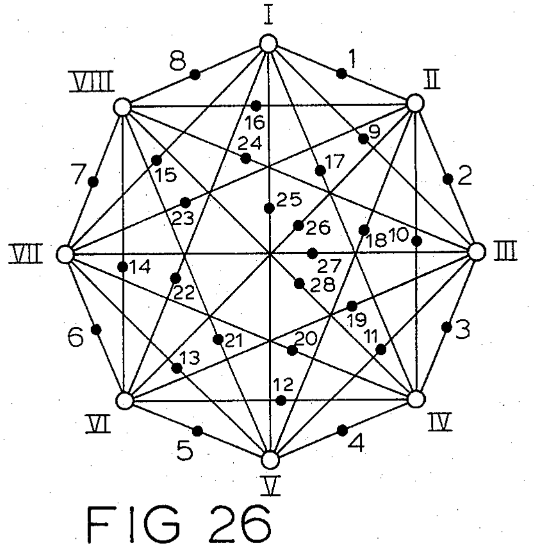
FIG 26
COLUMN LABELS
$$H_S = \begin{bmatrix} 1 & 0 & 0 & 1 & 0 & 1 & 1 \\ 0 & 1 & 0 & 1 & 1 & 1 & 0 \\ 0 & 0 & 1 & 0 & 1 & 1 & 1 \end{bmatrix}$$
(Column labels: A B C D E F G)
FIG 27
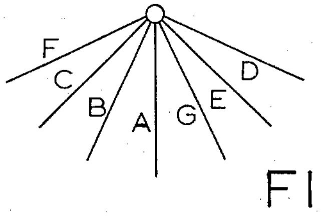
FIG 28
BIT NUMBER
| SUBCODE | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 |
|---|---|---|---|---|---|---|---|---|---|---|---|---|---|---|---|---|---|---|---|---|---|---|---|---|---|---|---|---|
| I | D | | | | | | | F | E | | | | | | C | | G | | | | | B | | | A | | | |
| II | F | D | | | | | | | | E | | | | | | C | | G | | | | | B | | | A | | |
| III | | F | D | | | | | | C | | E | | | | | | | | G | | | | | B | | | A | |
| IV | | | F | D | | | | | | C | | E | | | | | B | | | G | | | | | | | | A |
| V | | | | F | D | | | | | | C | | E | | | | | B | | | G | | | | A | | | |
| VI | | | | | F | D | | | | | | C | | E | | | | | B | | | G | | | | A | | |
| VII | | | | | | F | D | | | | | | C | | E | | | | | B | | | G | | | | A | |
| VIII | | | | | | | F | D | | | | | | C | | E | | | | | B | | | G | | | | A |
NOTE: EACH LETTER IS REPLACED BY THE CORRESPONDING COLUMN OF $H_S$
ALL BLANK POSITIONS ARE ZERO.
FIG 29

SIMPLE PRODUCT CODE

CORRESPONDING BIPARTITE GRAPH

NEXT PRODUCT

PARTIAL SKETCH OF GRAPH DASHED LINE INDICATES A DIAMETER 6 PATH

ERROR-CORRECTING CODING SYSTEM

BACKGROUND OF THE INVENTION

This invention relates to information processing systems, and in particular, systems involving the transmission or storage of digital information via some imperfect medium which can introduce errors (i.e. gained or lost "bits") into the information and means for protecting the information system against the adverse effects of such errors.

Very often the transmission or storage of a digital (e.g. binary) sequence introduces the possibility of the message being altered by random interferences arising in the medium which cause one or more bits comprising the binary data of the message to be changed from "1" to "0" or vice versa: telephone lines can be subject to error impulses and interference from other messages; magnetic tapes and discs can have minor imperfections; generally any processing by circuits with tubes, transistors, diodes, or elements subject to electrical failure has a possibility of introducing such errors.

To check for errors, data can be echoed back to the sender by the receiver for verification before being acted upon. This technique is effective but adds greatly to the system overhead. Moreover, under particularly bad communications conditions it may be virtually impossible to transmit error-free messages so that verification is non-existent.

One of the key results of early work in information theory was that it is theoretically possible, by means of coding which adds carefully designed redundancy to the message, to protect information against such errors. The original message is encoded into a longer message from which a decoder can recover the original message, even if the longer message has been partially mutilated.

For example, each one could be replaced by three ones and each zero by three zeros. In such a scheme if the message to be sent were 1010, it would be encoded and transmitted as 111000111000. Such a system could correct one error in each encoded digit. If a 000 sequence picked up a bit in transmission and appeared to the receiver as 100, 010, or 001, it would be closer to 000 than 111 so that the digit 0 could still be validly interpreted and the error corrected by the decoder at the receiving end. It can be seen that two errors in the same digit would be fatal. A 000 received as 110, 011, or 101 would appear most likely to have been, or closer to, 111 than 000 and be misinterpreted as a 1 rather than a 0.

Continuing in the same manner, each one or zero could be transmitted as a larger number of ones or zeros, say ten, twenty, or more. This is shown diagrammatically in FIG. 1. A four digit message word 10 is mapped into the codeword 12 which is then transmitted in a time domain represented by the arrow 14. Sources of error, however, quite often occur in "bursts" lasting for a finite period of time as represented by the cross-hatched area 16. Since all the data representing each digit is grouped together, such a scheme is highly vulnerable to burst errors as can be seen.

FIG. 2 diagrammatically shows a typical solution to the burst error problem. That is, the codeword 12' is made long and the data for each digit is scattered throughout the length of the codeword 12' so that a single burst error can effect only a portion of the data for any individual digit leaving enough data for each digit to permit satisfactory error correction in the received and decoded message.

Although tremendous attention has been devoted to the problem of designing systems to carry out this theoretically possible protective function, all attempts to data have shortcomings which limit their effectiveness in practical applications, particularly for relatively long codes. The shortcomings arise in different ways, and thus it is possible through systems design to trade off one weakness against another, designing a system to avoid one limitation by allowing another.

To understand the advance made by the present invention, it is necessary to examine more closely the nature of the difficulties standardly encountered. For purposes of discussion, the problem will be treated as one of protecting messages generated by a message source, transmitted across a noisy channel, and received at a message sink. As will be recognized by those skilled in the art, the same conceptual framework is applicable to problems of information storage and to some forms of computation.

In protected message transmission, the original message is encoded at the sending end by an encoder, the encoded message is then transmitted, and finally the received message is decoded by a decoder to produce the original message at the receiving end.

An encoder can be thought of as a device which implements a function which maps a sequence of message digits into a longer sequence of channel digits, the encoded message. Because the channel sequence is longer, it is possible to find functions which can map any two distinct messages into very different channel sequences. With sufficiently different sequences, several errors can occur, changing one channel digit into another, without causing the received sequence to resemble a different encoded message more closely than it does the one actually sent. Thus if every received sequence is assumed to be a mutilated version of the correct encoded message it resembles most closely, the message will be protected against some error patterns.

The encoder determines the quality of the code: a good encoder guarantees that the encoded messages are all very different.

A decoder implements a function mapping the long sequence of received symbols back into sequences of message digits. The best decoder will map each possible received sequence into the message sequence which is the most probable cause of that received sequence, taking the characteristics of the possible errors into account.

The fundamental obstacle to the design and use of the "best" encoders and decoders is complexity. First, it is impossible to find the "best" code for anything but very short length codes. There are simply too many possible codes, and even the fastest existing computers cannot exhaustively compare all the codes to determine the best one. Second, even if the best codes could be found, they might still be impractically complex just to use.

In the past, it has been typical to design the code first and then a means for implementing it. The result of this approach is a vast array of implementation techniques which impose far less than optimal space and time limitations on the using equipment. As far as actual implementation is concerned, table look-up, which can be used to implement any encoder and decoder functions, requires a table of a size which is exponentially related to the code length. Thus, it is totally impractical to use table look-up for any really useful code. Consequently, encoder and decoder mappings are normally carried out by a computational process. With a computational process, the difficulty is that good encoders and decoders can require so many computations that they are too costly and too slow to be useful. In virtually all existing coding schemes, the decoder complexity is the limiting factor. The largest length code which can be practically used is determined by the acceptable computational load for the decoder.

To minimize the complexity problem, compromises are possible. The encoding and decoding can be simplified by using a simpler, but less effective, code. Without changing the code, it is often possible to simplify the decoder by allowing the decoding to fail. That is, have a finite probability that the received sequence may sometimes be incorrectly decoded or not decoded at all. Other systems will operate effectively against only certain types of errors, such as burst errors as described above, where errors are most likely to occur in contiguous symbols. This general strategy is one of designing systems based on a model of the channel which is simpler than the actual channel.

An important case of the latter strategy typically employed is the discarding of channel reliability information. For example, on a binary channel where zeroes and ones are transmitted as two pre-assigned voltage levels, the receiver often has available more than just a zero or a one.

This is shown diagrammatically in FIG. 3. A "1" is represented by voltage level $V_1$ and a "0" is represented by voltage level $V_0$. If a pure 0 and 1 are transmitted, as represented by the two voltage levels 18 and 20, the received voltage levels 18' and 20' may not be exactly $V_0$ and $V_1$. If the received voltage level were midway between $V_0$ and $V_1$ as represented by dotted line 22, the probability of the unknown signal being a 1 or a 0 would be 0.5. That is, by picking either value there is a 50% chance that the choice is correct. The closer the received voltage is to the $V_1$ and $V_0$ voltage, the higher the probability that it is the digit represented by that voltage.

By taking advantage of the foregoing, the demodulation equipment may provide an additional continuous voltage, or the like, which indicates not only whether a zero or a one was apparently transmitted, but also the relative likelihood of each. This likelihood information is very valuable and, theoretically, can be used to reduce substantially the probability of system error. Unfortunately, most existing coding schemes are unable to use it. They operate simply on a "best guess" for each received signal. Once the guess is made there is no changing it. The popularity of a coding technique known as "convolutional coding" rests heavily on the ability of the associated decoding apparatus to make use of this data reliability information. Unfortunately, convolutional coding also produces localized coding as in FIG. 1 which is highly burst error sensitive.

With this background, the objects of the present invention can be summarized as follows: First, to provide a technique and environment for implementing codes having quality comparable to, and in some cases, superior to, that of the best known codes. Second, to provide a technique and environment for the construction of codes of almost any desired length and rate, and particularly powerful for construction of long length codes. Third, to provide a technique and environment for the design and implementation of codes effective against a wide variety of channel models and making near-optimum use of channel reliability information. Finally, to provide both an encoding and decoding process and apparatus structured to be of low computational complexity. It is the prime objective that the unique structure of the decoding process lead to orders of magnitude reduction in the cost of decoding long codes when compared to other coding schemes offering similar levels of error protection.

SUMMARY

The foregoing objectives have been attained by the method of establishing a family of codewords which can be corrected for induced transmission errors comprising the steps of: selecting a connected bipartite undirected graph having a plurality of first nodes and a plurality of second nodes connected together by a plurality of edges and wherein none of said first nodes are connected to another of said first nodes and none of said second nodes are connected to another of said second nodes; assigning a digit position for the codeword to each of said first nodes; assigning subcode definitions to be associated with each of said first nodes; assigning a set of values to be associated with selected ones of said second nodes such that as inputs to the ones of said first nodes connected to said selected ones of said second nodes said subcode definitions thereof are satisfied; establishing said set of values in the digit sequence assigned as a member of the family of codewords; and, repeating the foregoing procedure for different sets of values until the desired number of members of the family have been established.

In the preferred embodiment, the subcode definitions are identical.

To best achieve the objectives, the selected graph is one wherein the girth is approximately twice the diameter where the "diameter" is the maximum of the minimum length path connecting said nodes taken in pairs and the "girth" is the length of the shortest possible path for starting at one of said nodes, visiting distinct ones of said nodes, and returning to said starting node.

To achieve the objectives to an even higher level, the selected graph has a girth greater than four.

As applied to data transmitting apparatus wherein a selected member of a family of codewords is transmitted, thereafter received in a modified state, and then interpreted at the receiving end as being the member closest in appearance to the modified codeword, the inventions includes the method of transmitting and correcting data comprising the steps of: establishing the family of codewords by the technique summarized above; placing the digits of each codeword as received following transmission in individual storage registers connected as inputs to test nodes corresponding to said first nodes of said graphs; testing the contents of said storage registers as inputs against such subcode definitions associated with said first node; using the contents of said storage registers as the received codeword if all said subcode definitions are satisfied, otherwise continuing to the next step; using the contents of said storage registers as the received codeword if a preselected number of corrective iterations have been tried, otherwise continuing to the next step; and, modifying the contents of at least one of said storage registers which is connected as an input to one of said nodes which has its associated subcode definition unsatisfied and returing to again test the contents of the storage registers against the subcode definitions.

To take advantage where data reliability information is provided by the receiving apparatus, the digits as received and stored in said storage registers each have a probability figure associated therewith that the digit is the digit indicated; and, said procedure includes testing said probability figures and allowing the modification of only those digits having a probability below a preselected level.

In an alternate approach for utilizing the data reliability information, the digits as received and stored in said storage registers each have a probability figure associated therewith that the digit is the digit indicated; and, said procedure includes calculating and storing new ones of said probability figures as a function of said modifications made to reflect the new true probabilities.

To implement the objectives in self-correcting data transmitting apparatus wherein a selected member of a family of codewords is transmitted, thereafter received in a modified state, and then interpreted at the receiving end as being the member closest in appearance to the modified codeword, the invention comprises: a plurality of storage registers for holding the digits of the codeword as received; and, a plurality of test circuit means connected to selected ones of said storage registers for sensing the contents of said registers, for testing said sensed contents as inputs against subcode definitions associated with each of said test circuit means and which subcode definitions are satisfied by all members of the family of codewords being transmitted, and for causing the contents of at least one of said storage registers connected to one of said test circuits means wherein said subcode definition is not satisfied to be changed.

To achieve low cost and ease of flexibility, said plurality of test circuit means test for the same subcode definition.

To take advantage of the data reliability information in the manner described above according to the one technique, said plurality of storage registers includes: means for receiving and maintaining a probability figure associated with each received digit of the codeword that the digit is the digit indicated; and, means for allowing only ones of said storage registers to be changed wherein the probability associated therewith is below a threshold amount.

To implement the other technique for taking advantage of the data reliability information, said plurality of storage registers includes: means for receiving and maintaining a probability figure associated with each received digit of the codeword that the digit is the digit indicated; and, means for calculating new probabilities to be associated with each digit and for updating said stored probabilities as a function of modifications made to said stored digits to reflect the new true probabilities.

DESCRIPTION OF THE DRAWINGS

FIG. 7 shows the H matrix for a simple linear code.

FIG. 8 is a graph of a single error-correcting linear code associated with the H matrix of FIG. 7 and having three subcodes.

FIGS. 9 through 11 are illustrations of some simple graphs ((a) figures) and their associated bipartite graphs (b) figures) with the girth approximately equal to twice the diameter prepared by inserting a node of degree two in the middle of every edge of the original simple graphs.

FIG. 26 is a bipartite graph of eight nodes analogous to the graph of FIG. 9.

FIG. 27 is the Hamming code matrix $H_S$ used with the illustrative embodiment.

FIG. 28 shows a typical assignment pattern for a node of the graph of FIG. 26.

FIG. 29 is the actual H matrix employed in the illustrative embodiment.

DESCRIPTION OF THE PREFERRED EMBODIMENT

Codes

Since the present invention has to do with codes, they will be considered first. The first codes to be described are block codes. A block of message digits is mapped into a block of channel digits for transmission. For simplicity, we will assume that the message and the channel use the same alphabet of digits. The length (in digits) of the information sequence for a particular code will be caled "K". The length (in digits) of the encoded sequence will be called "N".

The codes are defined recursively. The simplest versions give a method of using a small code, of length, say, n, to construct a long code of length N, with N much greater than n. Typically, N is polynomially related to n. In more elaborate versions, the long code can be based on more than one variety of small code. The small codes used in a particular construction will be referred to as "subcodes." The long codes will hereafter be referred to as "low complexity recursive" codes, or "LCR" codes for brevity.

Any existing code may be used as subcode in the construction, and the properties of the LCR code will tend to reflect the properties of the subcodes. For example, non-linear codes, codes for an asymmetric channel, Hamming codes (p. 117-120, Peterson, W. W., and Weldon, E. H. Jr., *Error-Correcting Codes*, Second Edition, M.I.T. Press, 1972), Bose-Chaudhuri-Hocquenghem codes (Peterson and Weldon, Supra, Chapt. 9), Goppa codes (Goppa, V. D., "A New Class of Linear Correcting Codes", reprinted in Berlekamp, E. R., ed., *Key Papers in the Development of Coding Theory*, IEEE Press, New York, 1974, pp. 102-103), as well as codes already based on this construction, may be candidates. The freedom of choosing the subcodes, the freedom in selecting the construction, and the potential for recursion all combine to enable a rich and infinite number of LCR codes to be built. The key to understanding the entire class of block codes is the careful examination of a single recursive step in the construction. The technique is sufficiently powerful that for most practical applications a single recursive step will usually be sufficient.

Graphs

Figure 1:
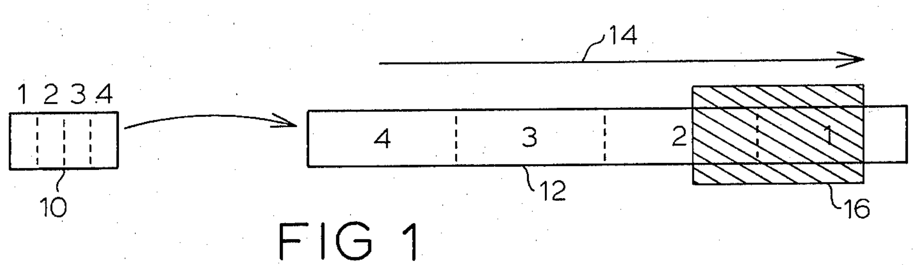
FIG. 1 is a diagram of a four-digit message word mapped into a codeword wherein the data associated with each digit is clustered or grouped.
Figure 2:
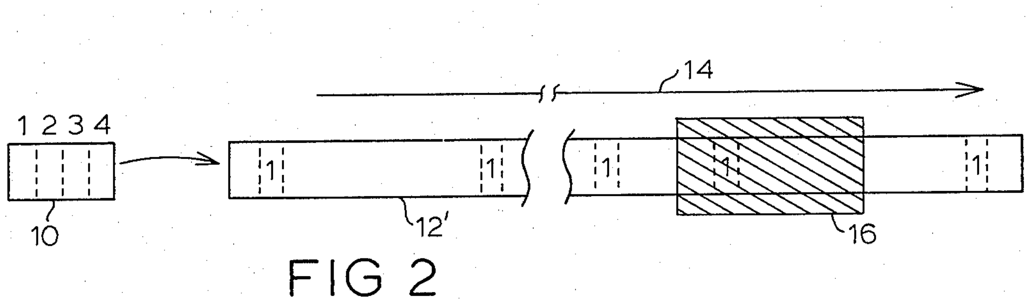
FIG. 2 is a diagram of a four-digit message word mapped into a codeword wherein the data associated with each digit is scattered throughout the codeword to resist burst errors.
Figure 3:
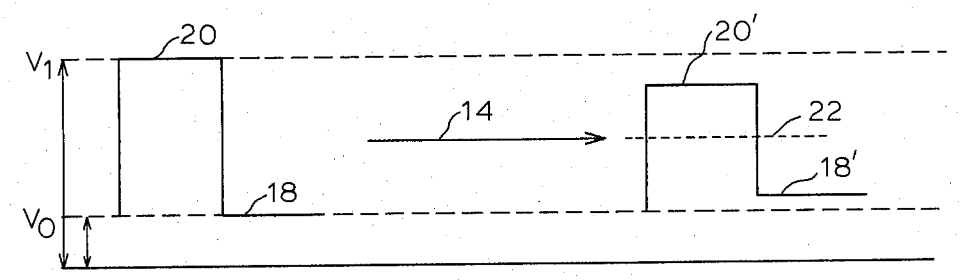
FIG. 3 is a diagram showing voltage levels associated with the ones and zeroes comprising binary data as sent and as received.
Figure 4:
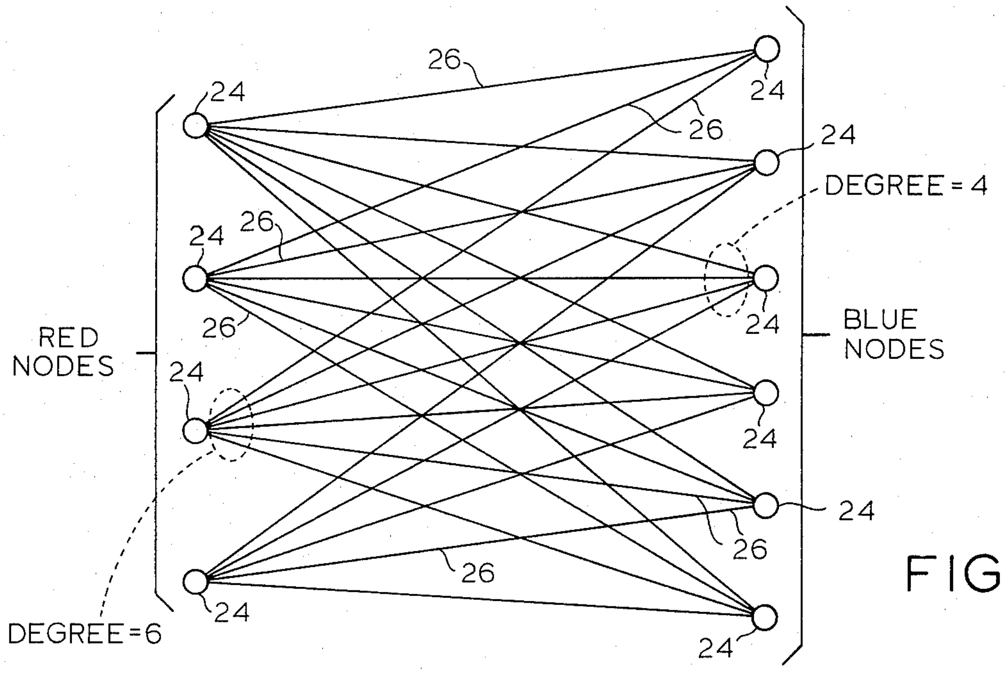
FIG. 4 is a connected bipartite undirected graph of four "red" nodes and six "blue" nodes.

The construction is based on a connected bipartite undirected graph. An example of such a graph of four red nodes and six blue nodes is shown in FIG. 4. An undirected graph is a collection of points 24, called nodes or vertices, connected by lines 26, called edges or arcs. A bipartite graph is a graph where there are two types of nodes, say red and blue, with the property that there exist edges connected red nodes to blue nodes, but no edges connecting reds to reds or blues to blues. A graph is connected if for any two nodes in the graph there exists a sequence of edges, or path, connecting the two nodes.

To form an LCR code from such a bipartite graph, one class of nodes, say red, is chosen to represent subcode nodes, the other class to represent digits of the code. Associated with each red node in the graph is a subcode whose length, n, equals the degree of the node, where the number of edges connecting a particular node is the "degree" of the node. Since there are n digits adjacent to the subcode node, it is possible to impose the requirement that the n digits form a legitmate word in the subcode, with each of the adjacent digits filling the role of a particular digit position in the subcode. Another subcode node will be adjacent to a possibly different subset of the digit nodes. With each of those digits being assigned a particular position in that subcode, the condition that those digits must form a codeword in that subcode can be similarly imposed. Extending this idea to all of the subcodes of the graph give the following definition of a codeword in the LCR code: A set of N digits associated with the N distinct digit nodes of the bipartite graph form a codeword in the LCR code if and only if the digits adjacent to each subcode node of the graph are a codeword in that subcode, with each of the adjacent digits assigned a specific, fixed position in the subcode.

Figure 5:
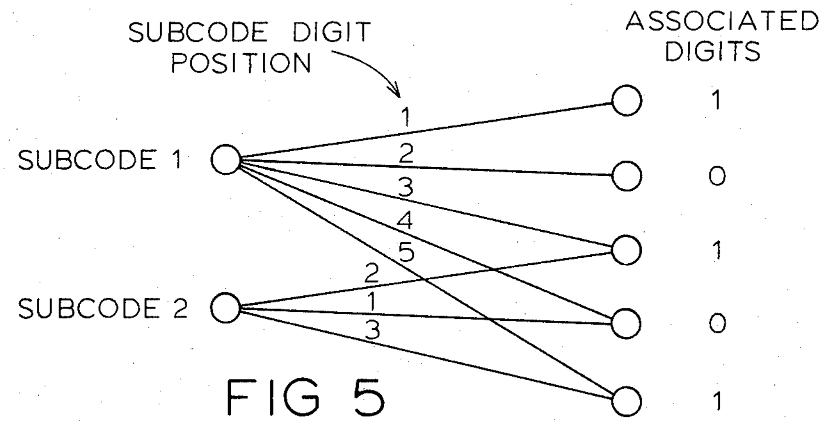
FIG. 5 is a graph employed according to the present invention to define a codeword having a first subcode of 5 digits and a second subcode of 3 digits.
Figure 6:
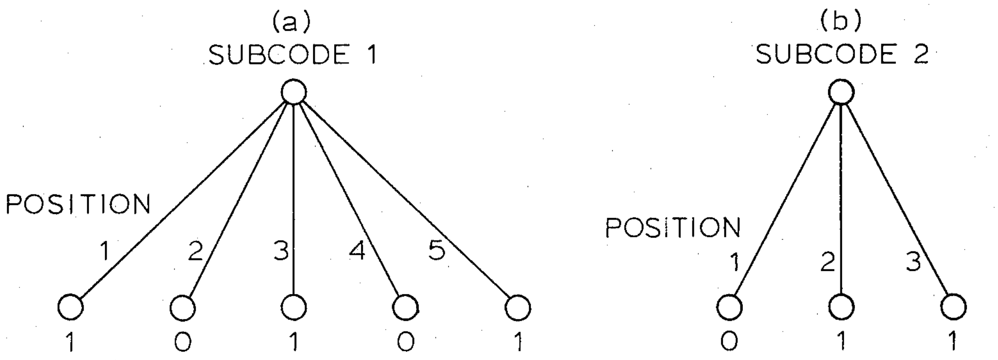
FIGS. 6(*a*) and 6(*b*) are diagrams showing the structure of the first and second subcodes of the graph of FIG. 5 respectively.

The meaning of this definition should be made clearer by consideration of the simple example illustrated in FIGS. 5 and 6. As depicted, 10101 is a codeword in the LCR code defined by the graph of FIG. 5 if, and only if, the two separate conditions of Subcode 1 and Subcode 2 as shown specifically in FIGS. 6(*a*) and 6(*b*) are met. That is, if 10101 and 011 are both codewords in the respective subcodes.

Without further restriction, this definition of the codes is sufficiently broad to include all linear codes. A linear code is the set of codewords, C, satisfying the matrix equation $$H \cdot C = 0$$

where H is an N-K by N matrix of elements from some field, and C is a 1 by N vector of field elements. Each row of the matrix constitutes a generalized parity check subcode on the digits corresponding to non-zero entries in the matrix. The leads immediately to an interpretation of the code as a bipartite graph of the type given above. For binary codes, the H matrix represents a version of the connection matrix for the bipartite graph. This interpretation is illustrated for a simple linear code in FIGS. 7 and 8.

It is a distinguishing feature of the codes implemented according to the present invention that not all of the subcodes are simple parity check codes in the binary case or the generalization thereof for higher order fields.

Not every bipartite graph is suitable for the construction of good LCR codes. Each digit of the code is related to each other digit via all paths in the graph which connect them. The best codes are based on graphs in which all digits are, in some sense, maximally connected in a balanced way. The best characterization of such graphs is in terms of the diameter and girth of the graph. The "diameter" of a graph is the maximum over all pairs of nodes of the minimum length path connecting the two nodes. It is a measure of the greatest possible separation between two nodes in the graph, hence the term diameter. The "girth" of a graph is the length of the minimum cycle in the graph, the shortest path visiting distinct nodes and returning to the starting nodes. In these terms, the graphs of greatest interest for the construction of LCR codes are those where the girth is approximately twice the diameter. Since the minimum cycle can be no longer than twice the diameter plus one, this represents a condition preventing the graph from having short cycles, or two short paths relating two digits, while at the same time another pair of digits are related only via a much longer path. This tends to drive an errored message toward the true message in the shortest time in the decoding process.

As will be discussed hereinafter in greater detail, a large number of well-known and important algebraic codes can be interpreted as being codes based on graphs with girth=4 (representing the condition of two digits both being checked by two different subcodes). A distinguishing feature of the unique codes of the present invention is that underlying graph has girth greater than four.

Figure 11:
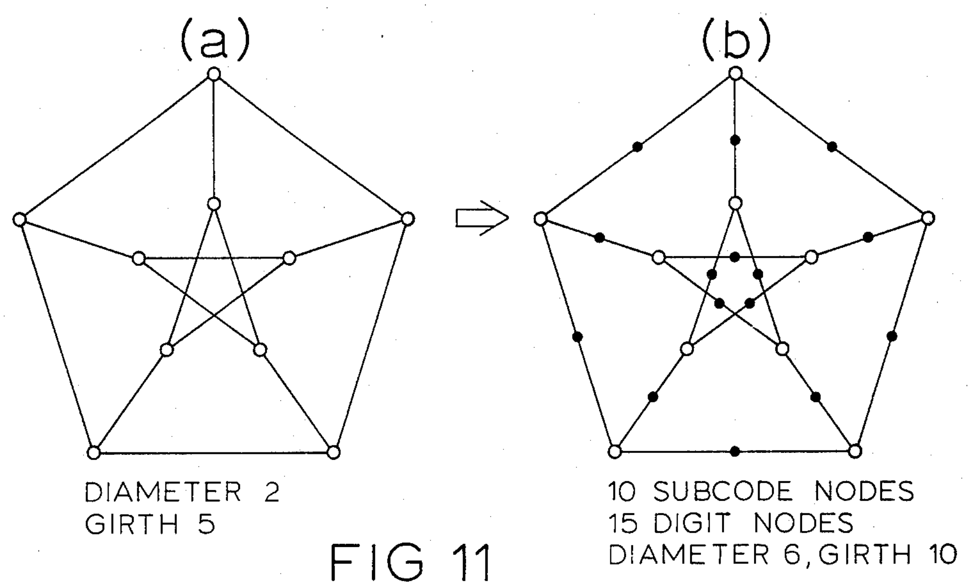

Graph theory provides a rich variety of graphs with the desired properties and an unlimited number of graphs meeting the requirement approximately are cleary available. Some which have already been well studied are, for example, Moore graphs (See Hoffman, A. J., and Singleton, R. R., "On Moore Graphs with Diameters 2 and 3", IBM Journal of Research and Development, Vol. 4, November 1960, p.p. 497–504) and graphs built from generalized polygons (see Dembrowski, P., Finite Geometrics, Springer Verlag, New York, 1968, pp. 300–305). These have the property that the subcode nodes all have the same degree, and thus the same subcode can be used for every node in the graph. This permits simpler implementation as will be discussed in greater detail hereinafter. It is worthwhile noting that any graph can be made into bipartite graph by simply inserting a node of degree two in the middle of every edge of the original graph. The original nodes are in one partition, the new nodes in the other. FIGS. 9 through 11 illustrate some simple graphs with girth approximately equal to twice the diameter prepared in this manner.

Assignment of Subcode Digit Positions

Given a graph and subcode associated with each subcode node, the LCR code is not completely specified until the role that each digit adjacent to a subcode plays in that subcode is specified. For example, if the subcode has length 7 there will be seven digits adjacent to that subcode. Each digit may be assigned the role of the first digit in the code, or the second digit in the code, and so forth. The particular pattern of assignments chosen determines the condition imposed on the relationship between the seven digits, and there are potentially seven factorial (i.e, 7! or $7\times6\times5\times4\times3\times2\times1=5040$) different possible assignments. Each of these assignments at each of the subcode nodes can lead to a different LCR code, although in practice a great many of the different assignments lead to the same or equivalent codes.

The length of the LCR code is determined by the number of digit nodes in the graph and is unaffected by the assignment pattern chosen. The code parameters which are dependent on the assignment are the rate of the code, the number of information digits that can be encoded by the code of that length, and the distance structure of the code, the extent to which codewords tend to be different. Not all possible assignments will necessarily lead to optimum codes, but a variety of good quality codes can be made from the same graph with the same basic subcodes by varying the assignments.

Figure 12:
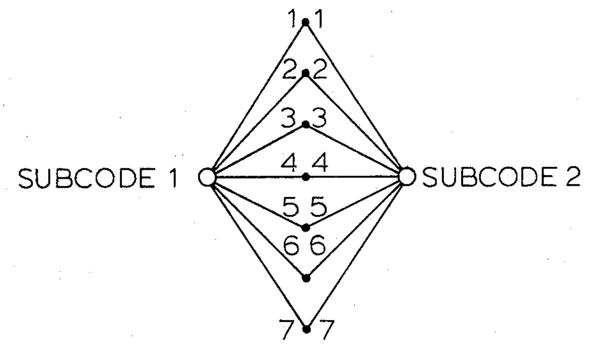
FIG. 12 is a graph of girth 4 having two subcodes of identical digit position assignment.
Figure 14:
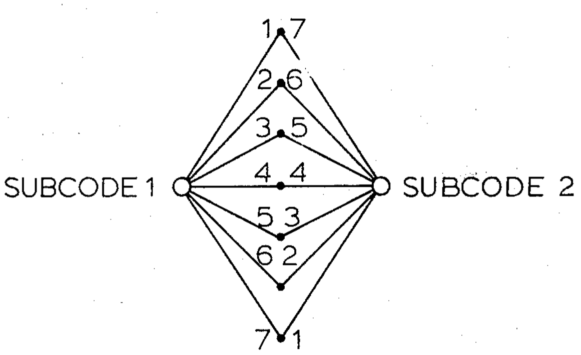
FIG. 14 is the same graph of FIG. 12 with different positional assignments to the digits of the two subcodes to produce different results.
Figure 13:
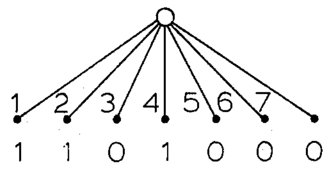
FIG. 13 is a typical codeword for the graph of FIG. 12.

An illustration of the effect of assignments in the simple case of a graph of girth 4 can be seen with reference to FIGS. 12–14. Referring first to FIG. 12, the assignment of the digit positions is the same for both subcodes as shown. Both subcodes are the Hamming (7,4) cyclic code with the associated H matrix being as shown in FIG. 7. A typical codeword is shown in FIG. 13. Under these conditions, the code is just the original Hamming code since both subcodes impose the same conditions on the bits.

Turning now to FIG. 14 as defining the digit positions with all other conditions being the same, it can be seen that the two subcodes impose different conditions. In fact, as thus defined, the only solution to both subcode requirements is the all ones (i.e. 1111111) codeword. The final code is then a (7,1) with minimum distance being 7.

Although not every assignment necessarily yields the best possible code, it is not difficult to show that the properties of the graph guarantee that no assignment can lead to a very bad code. The index of quality to be considered is the minimum Hamming distance of the code. That is, the minimum number of digits by which any two codewords must differ. The minimum distance for the LCR code must grow exponentially with the girth of the graph for a fixed subcode and digit node degree. This argument is diagrammed in FIG. 15.

Tree Bound on minimum distance

Let d be the minimum Hamming distance of the single subcode acting at all subcode nodes, D the minimum Hamming distance of the resulting code, m the degree of the digit nodes, and g the girth of the bipartite graph. Then:

$$D \geqq d\,\frac{[(d-1)(m-1)]^{\frac{g-2}{4}}-1}{(d-1)(m-1)-1} + \frac{d}{m}[(d-1)(m-1)]^{\frac{g-2}{4}} \text{ for } g/2 \text{ odd,}$$

$$D \geqq d\,\frac{[(d-1)(m-1)]^{g/4}-1}{(d-1)(m-1)-1} \text{ for } g/2 \text{ even.}$$

Figure 15:
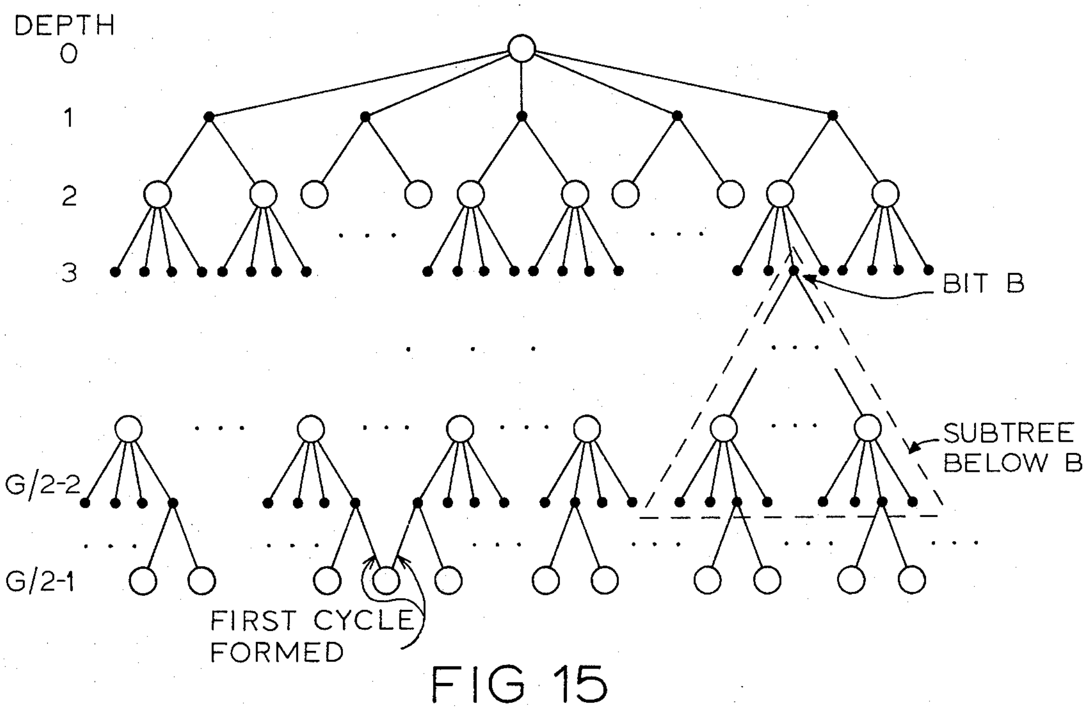
FIG. 15 is a tree graph depicting that the minimum distance for the LCR code must grow exponentially with the girth of the graph for a fixed subcode and digit node degree.

Proof: Suppose two codewords differ in a digit connected to a particular subcode note. Arrange the graph in the form of a tree with that subcode as root, as shown in FIG. 15. The two codewords must differ in at least d digits at the highest digit level. The minimum distance of the subcode nodes at the next level down ensures that, descending to the next digit level, the codewords will differ along d(d−1)(m−1) branches. If all of these edges do not connect to distinct digit nodes, it implies that there is a cycle of length six. If the graph has girth greater than six, this next level of digits must have at least d[(d−1)(m−1)] digits where the codewords differ. The number of differing digits increases by a factor of (d−1)(m−1) at each new digit level, until at least a depth equal to g/2. If g/2 is odd, the first level where differing branches may join to form a cycle is a digit level, and each of these digits may terminate m different branches. This leads to the factor of 1/m in the last term. Summing the differing digits over all the levels yields $$D \geqq d \sum_{j=0}^{\frac{g-6}{4}} [(d-1)(m-1)]^j + \frac{d}{m}[(d-1)(m-1)]^{\frac{g-2}{4}}$$

for g/2 odd and $$D \geqq d \sum_{j=0}^{\frac{g-4}{4}} [(d-1)(m-1)]^j$$

for g/2 even, which reduce to the expressions given.

It is possible to derive a different bound by using a digit as the root, but the given bound will always be better so long as $d \geqq m+2$.

Unfortunately, the bound is relatively weak. While the distance D grows exponentially with the graph girth, so does the code length N. Looking again at the tree, it is easy to see that $$N \geqq n \frac{[(n-1)(m-1)]^{g/4} - 1}{(n-1)(m-1) - 1}$$

for g/2 even. Consequently, this bound alone does not prevent the ratio of minimum distance to code length from approaching zero as the girth of the graph is increased.

The bound will be strongest if the length of the code achieves equality in this last equation thereby minimizing the length for a fixed lower bound on the minimum distance. Then, all digits in the code are contained in the tree of FIG. 15 when it is extended to the level where the first cycle is formed. For such a graph, the graph diameter, the length of the path connecting the most distant pair of nodes in the graph, is $t = \lfloor g/2 \rfloor$. The girth of undirected bipartite graph must always satisfy $g \leqq 2t+1$, as the following argument shows:

Let $v_1$ and $v_2$ be two nodes in the graph for which the shortest path has length t, and let $v_3$ be the first node encountered on another path from $v_1$ to $v_2$. By definition of the diameter, the minimum path from $v_3$ to $v_2$ must have length less than or equal to t. Clearly this path cannot include $v_2$. Therefore, there is a cycle from $v_1$ to $v_2$ to $v_3$ and back to $v_1$ of length less than or equal to $2t+1$. The condition $t = \lfloor g/2 \rfloor$ is, therefore a fairly stringent requirement on the graph. With a graph satisfying this, however, any node in the graph can be used as the root of the tree of FIG. 15 and the tree will contain all the nodes at depth $(g/2)-1$ or less.

Fortunately, the existing literature provides many avenues for constructing regular graphs satisfying the girth condition approximately if not precisely. By inserting digit nodes in the edges of a Moore graph or of a graph based on a generalized polygon, bipartite graphs with digit node degree two that satisfies the condition exactly can be obtained at a variety of sizes and girths. Although this mathematical approach cannot as yet furnish perfect graphs with girths greater than 24, this poses no particular obstacle from a practical point of view. For example, starting from the projective plane PG (2,q), $q=16$, which has $(q^3-1)/(q-1)$ lines and an equal number of points, a graph can be formed by creating a subcode node for every point P and every line L and an edge between any two points P and L, such that point P is on line L. The graph has $2((q^3-1)/(q-1))=546$ nodes, each of the degree $q+1=17$. Because any two points lie on a unique line, it is not difficult to prove that the graph is a generalized hexagon with diameter 3 and girth 6. Inserting a digit node for each edge creates a bipartite graph with diameter 6 and girth 12. Combined with any subcode of length 17, it yields a code of length 4641.

Encoding

The form of the best encoder for an LCR code will necessarily depend on the specific graph, subcodes, and assignments. In general, a certain fraction of the digits can be given values at will from the information sequence. The remaining values are then determined from the subcode constraints. Various procedures for finding the values for the remaining digits are possible. Some methods will be better in some instances, and others better in other cases. For linear codes, the linear structure alone is sufficient to guarantee the existence of reasonably simple encoding processes, and additional structure within the subcodes can reduce the difficulty dramatically. For non-linear codes, an iterative procedure, analogous to the decode process to be described hereinafter, may be the most efficient.

If all of the subcodes are linear, the LCR code will be linear. In such cases, as previously mentioned, the set of codewords corresponds to the set of solutions to a matrix equation. Consequently, encoding can be done by any of the conventional techniques for solving such equations. For example, the H matrix can be put in standard row-echelon form, from which an encoder requiring order K (N-K) computations per message may be constructed. (Recall that K is the number of information digits in the LCR code.)

In most practical applications, it is likely that using the same subcode at each of the subcode nodes of a regular bipartite graph will give best results. This will be pursued hereinafter with respect to implementation. With additional regularity in the assignment, the LCR code will have enough structure to permit encoding with a simple feedback shift-register, as is common in existing prior art coding schemes. The illustrative embodiment presented in a later section of this specification provides an example of such an encoder.

Transmission order for the digits

Thus far, the digits of the LCR code have been treated only as corresponding to the unordered digit nodes of the graph. Under normal circumstances, the digits will be transmitted in some temporal sequence (or perhaps spatial sequence, in the case of storage media). The ability of the code to correct the errors introduced by the channel can be affected by the particular transmission order chosen, particularly with respect to burst errors.

Because the LCR code is based on many subcodes, it will be easiest for the decoder to correct error patterns that do not have errors heavily concentrated in just a few of the subcodes. Patterns which have a low density of errors spread more or less uniformly throughout the subcodes will be corrected most rapidly. Consequently, if the channel errors tend to occur in bursts, it will be advantageous to choose a transmission order that causes such bursts to be spread out over the subcodes. This can be easily accomplished by picking the digits to transmit successively from subcodes which are far apart in the graph, to the extent that it is possible. In general, the order should be matched to the characteristics of the decoder so as to cause the burst or bursts to be correctly perceived by the decoder as a number of low weight and correctable errors in the subcodes. Following this procedure should give the LCR code outstanding capabilities against a mixture of multiple bursts and random errors.

Decoding

The structure of the LCR codes is specifically designed to make decoding complexity, the usual weakness of existing codes, exceedingly low. Indeed, there is evidence (based on some work in the Soviet Union which is not yet readily available) that the lower bound to the asymptotic complexity of decoding an efficient code is approximately the asymptotic complexity of the members of the class of LCR codes.

For the very short codes, the decoding procedure is sufficiently simple that any number of conventional techniques may prove best. For example, if the LCR is a linear code, the standard techniques of calculating an error syndrome and using combinatorial circuits to correct may be possible. As the length of the code becomes greater, however, the decoding method described as follows, will be more effective and economical.

Detection

Before moving to the explanation of the more involved error-correction procedures, the use of LCR codes for detection warrants a brief comment. For virtually all coding schemes, it is much simpler to detect the presence of errors which do not transform one codeword into another than it is to correct the errors. LCR codes are similarly well-adapted for detection. Since the codewords are defined to be any set of digits satisfying all of the subcode relations, the correctness of a codeword can be verified by verifying that all of the subcode constraints are satisfied by the received digits. This involves running an error detection check for each of the subcodes. Thus, detection for the LCR code comprises the sum of the detection operations for all of the subcodes. It should be recognized, therefore, that for successively larger LCR codes based on graphs with a fixed digit node degree, the complexity of detection grows linearly with the length of the code. Each digit is involved in a fixed number of detections of fixed complexity, and thus the number of computations per digit stays fixed. Since the asymptotic complexity of detection for any coding scheme must be at least linear, the asymptotic order for LCR codes is thus optimal. This is an important distinction associated with the present invention as will be seen in the discussions on implementation contained hereinafter.

Error Correction

The error-correction procedure for LCR codes is one of the most dramatic features of the present invention but, correspondingly, probably the most difficult to grasp initially. The key concept is the following—The low complexity of error correction for LCR codes is achieved by the decomposition of the process for the entire code into an ensemble of independent decoding procedures carried out, usually iteratively, by each of the constituent subcodes. Information is passed from one subcode to another only through statistics, and the generation of statistics, associated with the digit (or digits) they have in common.

In the same way that the over-all detection procedure can be performed by an independent check of each subcode, correction is achieved through repeated, virtually independent computations for each of the subcodes. it is the independence of these subcode operations, the absence of complicated interdependent computations, that gives LCR codes implemented according to the present invention an uncommonly low computational complexity. Those familar with coding theory may find it useful to think of these decoding schemes as generalizations of those specific techniques proposed by R. Gallager for his low-density parity check codes (See Gallager, R. G., *Low-Density Parity-Check Codes,* M.I.T. Press, 1963, Chap. 4) and those used for the product codes of P. Elias (See Elias, P., "Error-Free Coding", *IRE Transactions on Information Theory,* Vol. PGIT-4, pp. 29–37, September 1954).

To explicate the central notion, a series of increasingly refined approaches to the process can be employed. In all of them it is convenient to think of each subcode node in the graph as having associated with it a special mini-computer capable of executing a specific decode procedure for the subcode at that node. With the exception of a central controller which sequences and coordinates the executions at each node, the processors are autonomous and perform the computations solely on the contents of registers associated with each of the digits checked by the subcode.

Procedure One

In the simplest procedure, there is a single register for each digit which contains a current best guess for that digit. Initially each register is loaded with the best guess for that digit as supplied by the channel receiver. The central control then requests each subprocessor, one-by-one in some prescribed order, to attempt to correct any errors in the bits as perceived by that subcode. Each subprocessor may change some digits, and the next subprocessor will operate on the new digits. The entire cycle of subprocesses may be repeated a fixed number of times, or terminated earlier if no digits are changed.

This procedure is just the generalization of the detection scheme and for fixed node degrees and fixed number of iterations will have a complexity which grows only linearly with code length. It will operate successfully against error patterns where the errors in each subcode are correctable by the subcode. In addition, it will do well against patterns with errors correctable within the perspective of some set of the subcodes. As an example of the latter, consider an error pattern which mutilates every digit checked by one particular subcode in the graph. If the graph has girth greater than four, those errors will necessarily appear as single errors in all of the other subcodes connected to the digits in error. They will thus be corrected by those subprocesses.

Procedure Two

Rather than a single copy of each digit being accessed by all of the subprocessors checking that digit as with Procedure One, a separate copy for each of the subprocessors can be kept. The number of registers is then the degree of the digit node. Initially all registers for a digit are loaded with the best guess for the digit as received from the channel. In the first phase, the central controller causes a simultaneous decoding of all subcodes by the subprocessors working in parallel. Each subprocessor returns to its register for each digit it checks a corrected value for the digit. In the second phase, a computation is performed for each digit which decides what the new register contents should be based on the newly corrected values. For binary codes, this digit-by-digit computation may have, for example, the form of a threshold operation. If more than a certain fraction of the registers indicate the need for a change in the value of the digit, it is changed. If not, all registers are returned to the previous value. Various types of digit-by-digit register updates are possible even for binary codes, and for non-binary codes there is yet greater flexibility.

The two phases are alternated, first the decoding, then digit-by-digit update, until either a prescribed limit on the number of iterations has been reached, or no changes are made in any of the digits.

As before, if the number of iterations is fixed, independent of the graph size, the complexity of such a decoding process will grow linearly with code length. However, the full power of the code will not be realized unless the number of iterations is allowed to be at least proportional to the diameter of the graph. The received value of every digit should have an opportunity to affect the decoded value of every other through the propagation of information across the graph which occurs during the two phase iterations. It takes a number of iterations equal to half the graph diameter for information to cross the entire graph. Consequently the number of iterations should be at least as great as half the diameter of the graph, which is logarithmically related to the length of the code. Such a limitation will lead to a complexity which is of order NlogN if all of the iterations are, in fact, carried out without achieving a stable pattern of digit values.

Procedure Three

The next, and preferred, generalization is to consider each subcode as having a series of registers for each digit it checks. The registers for a digit contain a representation of the probability that the digit has a particular value, one register for each possible value. The subcode processes are then designed to update these probabilistic descriptions based on the knowledge that the correct values satisfy the subcode constraints. The digit-by-digit operations pass information about each digit from each subcode checking the digit to the others likewise checking it.

The underlying concept of decomposing the decoding process can be embodied in a variety of algorithms which lead to various levels of implementation cost and performance. To give some idea of the range of possibilities described in generalities above, three types of algorithms of increasing sophistication that incorporate aspects of product code decoders and probabilistic low-density parity check decoders are presented hereinafter. It will be useful to think of them as being carried out by a parallel architecture. Each subcode node in the graph has associated with it a special processor capable of executing a specific decoding procedure for the subcode at that node. Each digit node has associated with it one or more registers accessible by the subcodes checking it and a processor for updating the contents of the digits registers. With the exception of a central controller which sequences and coordinates the executions at each node, the processors are autonomous, and perform the computation solely on the contents of registers they access.

In the first procedure, there is a single register for each digit which contains a current best estimate for that digit. Initially each register is loaded with the estimate for that digit supplied by the channel receiver. The central controller then requests each subcode processor, one by one in some prescribed order, to attempt to correct any errors in the bits as perceived by that subcode. Each processor may change some digits, and the next subcode processor will operate on the new digits. The entire cycle of corrections may be repeated a fixed number of times or terminated earlier if no digits are changed.

Clearly, this is a simple generalization of the original product code decoding procedure. It will operate successfully against error patterns where the errors in each subcode are correctable by the subcode, and will do well when the errors are correctable within the perspective of *some* set of the subcodes.

In the second class of algorithms, there are multiple registers for each digit containing different estimates of the digit. There are two phases to the procedure. In the first, each subcode node processor receives a digit value from one of the registers of each of the digits it checks. Based on those values, the subcode processor computes corrections to be made and returns a "corrected" value for each digit to the corresponding digit register. In the second phase, the contents of all of the digit registers for each digit are updated by a computation based only on the contents of the registers for that digit. For example, this could be a threshold operation where all of the registers are set to the value occurring most frequently among the "corrected" values returned by the subcodes, or each register could be determined by a vote of all the other registers. The two phases are then alternated for a prescribed number of iterations. The final value for each digit is determined by a vote of all associated registers.

To illustrate with a specific algorithm of this type, consider a graph of girth g where all bit nodes have degree two, all subcodes have degree $2^m-1$, and each subcode node has associated a binary Hamming code of length $2^m-1$. There are three registers for each bit, one which stores the initial received value of the bit during the entire decoding process, and one for each of the two subcodes checking the bit.

Algorithm A

All three registers are initially loaded with the received value of the bit. During the first phase, each subcode takes in both the initial value of each bit and the value currently in its own register for that bit (two values for each bit checked). It then calculates a new value to be returned to its register for each bit as follows: the initial value of the bit used along with the current values of all other bits to form a codeword; if the single error correction procedure for the Hamming code indicates that the initial value is incorrect, then the new value is the complement of the initial value; if the correction procedure indicates that either the word is correct or some other bit is in error, then the new value is the initial value unchanged. This is carried out for every subcode in the code. Then, for each bit, the bit register values coming from the two subcodes are simply interchanged, so that the result of one subcode's correction is used in the next correction of the other. The two phases are alternated for $\lfloor (g-2)/4 \rfloor$ iterations. The final decoded value of a bit is the value in the two subcode registers when they agree, and the initial value when they disagree.

Algorithm A incorporates principles associated with both product codes and low-density codes mentioned above as specific narrow cases. It is probably not surprising then, that the probability of error in a bit can be made to go to zero asymptotically.

It would appear that any code based on a bipartite graph with bit node degree two, subcode node degree $2^m-1$, and the length $2^m-1$ single-error correcting Hamming code can be decoded by Algorithm A with bit error probability approaching zero as the girth of the graph approaches infinity, when used on a binary symmetric channel with crossover probability q if $q<1/(2^m-2)$.

This can be proved by starting with an arbitrary bit as root and drawing the code as a tree with that bit as root at the top. The nodes at even depths of the tree are other bits in the code. Looking first at the bits at depth $\lfloor 2g/4 \rfloor$ the first subcode correction will cause the "corrected" bits at the next level up to have probability of error $p_1$. It can be shown that $p_1<rq$ for some $r<1$. Clearly, these "corrected" bits are all statistically independent; consequently, after the next iteration the bits at depth $\lfloor 2g/4-2 \rfloor$ will have probability $p_2<r\,p_1<r^2q$. Continued iterations give the "corrected" bit at the top of a probability of error $$p=r^{\lfloor g/4 \rfloor}q$$

It follows immediately that p goes to zero as the girth goes to infinity.

Gallager's graph construction ensures the existence of graphs with arbitrarily large girths. Because the length of the code grows exponentially with the girth, this bit error convergence alone does not give asymptotically reliable communication. By making the initial crossover probability q sufficiently small, however, the ratio r can be made arbitarily small, which will cause the probability of decoding error to go to zero. More rapid convergence of the decoding error probability can be obtained by using a more powerful subcode or a higher bit node degree.

One of the major sources of weaknesses of this type of algorithm is the loss of information that occurs during a subcode correction. The result passed to the next subcode is simply a "corrected" digit, with no indication of the reliability of that "corrected" digit. The third type of algorithm to be considered, which generalizes the probabilistic decoder of low-density parity check codes, remedies this deficiency by using registers which carry probability estimates for the value of the associated digit.

Figure 16:
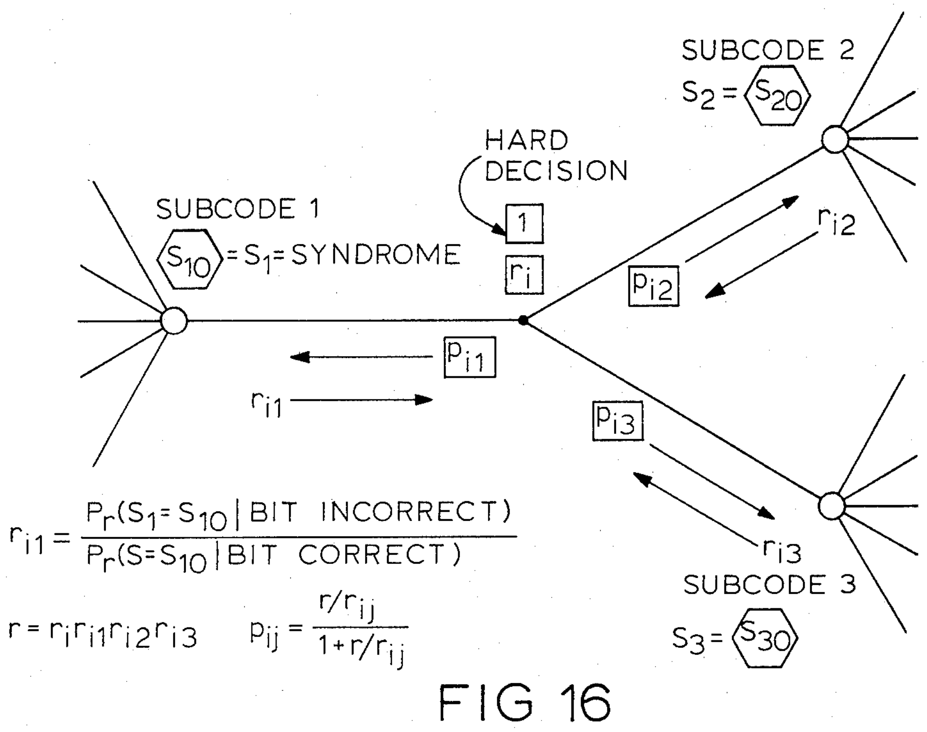
FIG. 16 is a diagram showing the computations which take place during a single iteration of error correction.

For clarity of exposition, the algorithm for the binary case with digit degree 3 is next presented. At each bit node there is one register that stores a hard decision value for the received value and another that stores the probability that that value is wrong, based on information from the receiver. In addition, there is a separate probability register for each subcode that checks the bit. These registers are initially loaded with the probability of bit error from the channel according to well known techniques which, per se, form no part of the present invention. At the start of the process, each subcode calculates a syndrome using the hard decision bit values. This syndrome is saved to be used throughout the process. As before, multiple iterations of a two phase process carry statistically independent information across the graph. The computations which take place during a single iteration are shown in FIG. 16. The underlying theory is the following: Let $p_i$ be the probability the bit is in error as supplied by the receiver. Let $p_{il}$ be the probability the bit is in error given $p_i$, the error probabilities for all the bits in all subcodes except the first, and the syndromes computed by all the other subcodes. Then, using Bayes law, $$\frac{P_{i1}}{1-P_{i1}} = \frac{Pr(\text{bit } i \text{ in error} \mid S_2,S_3)Pr(S_2,S_3)}{Pr(\text{bit } i \text{ not in error} \mid S_2,S_4)Pr(S_2,S_3)} = \frac{Pr(S_2,S_3 \mid \text{bit } i \text{ in error})P_i}{Pr(S_2,S_3 \mid \text{bit } i \text{ not in error})(1-P_i)}$$

Assuming all other bits in Subcode 2 and Subcode 3 are independent, $$= \frac{Pr(S_2 \mid \text{bit } i \text{ in error})}{Pr(S_2 \mid \text{bit } i \text{ not in error})} \cdot \frac{Pr(S_3 \mid \text{bit } i \text{ in error})}{Pr(S_3 \mid \text{bit } i \text{ not in error})} \cdot \frac{p_i}{1-p_i} = r_{i2}r_{i3}r_i$$

The ratio $r_{ij}$ may be computed for an arbitrary linear code by a procedure requiring memory and computation proportional to the length of the code times the number of syndrome states. Solving for $p_{il}$ reveals that:

$$p_{il}=r_{i2}r_{i3}r_i/(1+r_{i2}r_{i3}r_i)$$

By computing $r=r_{il}r_{i2}r_{i3}r_i$ and then dividing out the $j^{th}$ term, $p_{ij}$ can be computed for each subcode.

This procedure propagates information across the graph, bringing independent information towards each digit along all the paths of the tree emanating from that digit. After $\lfloor (g-2)/4 \rfloor$ iterations, the independence assumption breaks down, but there is good reason to believe that additional iterations are still effective in reducing the probability of error. At the end of the process, the final estimate for each bit is based on the stored original value and the computed probabilities of error of that value.

Since this probabilistic decoder incorporates error probabilities supplied by the receiver into the decoding process, it is able to take advantage of accurate channel models. The price paid for this generality is the need for fairly involved real arithmetic operations in both the subcode and digit phases.

The final algorithm presented will correct any pattern of $\lfloor (d_t-1)/2 \rfloor$ or fewer errors, where $d_t$ is the tree lower bound on minimum distance as described above. Again for clarity, the binary case is treated. Referring once again to FIG. 15, it can be seen that the tree lower bound was derived by showing that any pattern of bits which satisfies all the subcodes in the tree (meaning *only* those above the level where the first minimum cycle is formed) must have a minimum distance of at least $d_t$. The actual code is a subset of the set of vectors of bits satisfying the tree subcodes and, therefore, must have a minimum distance at least as large as $d_t$. The following algorithm is designed to decode the bits at the top of the tree to those values occurring in the vector of bits that satisfies all the subcodes in the tree and requires the fewest changes in the actual received bits. The vector itself may not be a codeword.

Algorithm B

The operation performed by each subcode is as follows: Let $R_1, R_2, \ldots, R_n$ be the contents of the n bit registers accessed by a particular subcode. For each register, the subcode computes a new value $R_i'$ given by $$R_i' = \tfrac{1}{2}\left[\max_{\substack{\vec{C}\epsilon e\\ c_i=+1}} (\vec{C}\cdot\vec{R} - R_i) - \max_{\substack{\vec{C}\epsilon e\\ c_i=-1}} (\vec{C}\cdot\vec{R} + R_i)\right]$$

where: C is the set of n dimensional real vectors of plus and minus ones, $(c_1, C_2, \ldots, c_n)$, each derived from a codeword in the subcode by replacing each 1 in the codeword by $+1$ and each 0 by $-1$; $\vec{R}$ is the vector of register values $[R_1, R_2, R_3, \ldots, R_n]$; and $\vec{C}\cdot\vec{R}$ means real vector inner product. All of the subcodes return the $R_i'$ values to the bit registers. The register is then reindexed so that $R_j'$, $j=1, 2, \ldots, m$ are the contents of the registers of a particular bit after the subcode phase has been completed. A new value is then computed for each register given by:

$$R_j'' = \sum_{l=1}^{m} R_l' - R_j' + V$$

where $V=+1$ if the bit was originally received as a one, $V=-1$ if it was originally received as a zero. Initially each register associated with a bit is loaded with the value V. After $\lfloor(g-2)/4\rfloor$ iterations, each subcode finds the vector $\vec{C}$ that achieves $$\max_{\vec{C}\epsilon e} [\vec{C}\cdot\vec{R}]$$

and returns the $i^{th}$ component of $\vec{C}$, $c_i$, to the $i^{th}$ register. Finally, the value of a bit is decided by a majority vote of the $R_i$ registers.

It can be proved as follows that any pattern $\lfloor(d_t-1)/2\rfloor$ or fewer errors will be corrected by Algorithm B because, in fact, *all* the values $c_i$ returned for a bit will be $+1$ if the bit was a one and $-1$ if it was a zero. The first step is the following lemma. Refer to FIG. 15.

Lemma 1

After i iterations of Algorithm B, the bit register of a bit at depth $\lfloor 2g/4\rfloor - 2 - 2i$ associated with the subcode directly above it will contain $Z_b - U_b$, where $z_b$ is the minimum number of bits that must be changed in the subtree below and including bit b for it to have value zero and have the subcodes in the subtree satisfied, and $U_b$ is the minimum number of bits in the subtree that must be changed for the bit to have value one.

Proof

The proof is by induction on the number of iterations. Clearly, for $i=0$ the lemma holds because the subtree contains only the bit itself and the register to the subcode above was loaded with $+1$ if the bit was received as a one, and $-1$ if received as a zero. Assuming, then, that it holds for $i-1$ iterations, consider the effect of the $i^{th}$ iteration on a bit b at level $2\lfloor g/4\rfloor - 2 - 2i$. The registers from the bits two levels below have the correct values. The register for the bit associated with a subcode on the level below will be returned a value equal to the difference in the minimum number of changes needed in the bits in the subtree below that subcode as follows: Without loss of generality, assume b is the first bit in that subcode. Let $R_j = Z_j - U_j$ be the register values from bit j, $j=1, 2, 3, \ldots, n$, in the subcode after $i-1$ iterations.

$$\begin{pmatrix}\text{Minimum number}\\ \text{of changes below}\\ \text{subcode for}\\ b=0\end{pmatrix} = \min_{\substack{\vec{C}\epsilon e\\ c_1=-1}} \left(\sum_{\substack{j>1\\ c_j=-1}} Z_j + \sum_{\substack{j>1\\ c_j=+1}} U_j\right)$$

$$\begin{pmatrix}\text{Minimum number}\\ \text{of changes below}\\ \text{subcode for}\\ b=1\end{pmatrix} = \min_{\substack{\vec{C}\epsilon e\\ c_1=+1}} \left(\sum_{\substack{j>1\\ c_j=-1}} Z_j + \sum_{\substack{j>1\\ c_j=+1}} U_j\right)$$

Let $^{-}\vec{C}$ be the vector achieving the first minimum, $^{+}\vec{C}$ the vector achieving the second minimum. The difference in changes needed below the subcode is $$D = \sum_{\substack{j>1\\ ^{-}c_j=-1,\ ^{+}c_j=+1}} (Z_j - U_j) - \sum_{\substack{j>1\\ ^{-}c_j=+1,\ ^{+}c_j=-1}} (Z_j - U_j) = \tfrac{1}{2}[\,^{+}\vec{C} - {}^{-}\vec{C}\,]\cdot\vec{R} - R_1$$

Now for any $\vec{C}$ with $c_1=-1$, $$\vec{C}\cdot\vec{R} + R_1 = \sum_{\substack{j>1\\ c_j=+1}} (Z_j - U_j) - \sum_{\substack{j>1\\ c_j=-1}} (Z_j - U_j) = \sum_{j>1} Z_j + \sum_{j>1} U_j - 2\left[\sum_{\substack{j>1\\ c_j=-1}} Z_j + \sum_{\substack{j>1\\ c_j=+1}} U_j\right]$$

Therefore, since the first term is independent of $\vec{C}$, $$\max_{\substack{\vec{C}\epsilon C\\ c_1=-1}} (\vec{C}\cdot\vec{R} + R_1) = {}^{-}\vec{C}\cdot\vec{R} + R_1$$

Similarly $$\max_{\substack{\vec{C}\epsilon C\\ c_1=+1}} (\vec{C}\cdot\vec{R} - R_1) = {}^{+}\vec{C}\cdot\vec{R} + R_1$$

Thus $R_1' = (\tfrac{1}{2})[(^{+}\vec{C}\cdot\vec{R} - R_1) - (^{-}\vec{C}\cdot\vec{R} + R_1)] = D$, so the value returned by a subcode to register for bit b is the difference in the number of changes needed in the bits below the subcode. The total difference in all of the subtrees below b plus the difference in the change in b itself is then $$R_j'' = \sum_{l=1}^{m} R_l' - R_j' + V,$$

the value placed in the register to the subcode above b.

It appears that Algorithm B will correct any pattern of $\lfloor(d_t-1)/2\rfloor$ or fewer errors.

Proof

Again referring to FIG. 15, by Lemma 1 after $\lfloor(g-2)/4\rfloor$ iterations the contents of the registers coming into the subcode at the top of the tree, $\vec{R} = (R_1, R_2, \ldots, R_n)$, will contain the difference $\vec{Z} - \vec{U}$. Let $^{\circ}$C. be the vector corresponding to the codeword in the subcode that was actually sent and let $^{1}\vec{C}$ be the vector for any other codeword in the subcode. By the proof of the tree bound, we know that if no errors occur during transmission $$\left(\tfrac{1}{2}\right)\left({}^{0}\vec{C} - {}^{1}\vec{C}\right)\cdot\vec{R} = \sum_{\substack{^0c_j=+1\\ ^1c_j=-1}} (Z_j - U_j) - \sum_{\substack{^0c_j=-1\\ ^1c_j=+1}} (Z_j - U_j) \geqq d_t$$

It is obvious that changing the received value for a single bit in the $j^{th}$ subtree can at most change $Z_j - U_j$ by 2. Therefore, if fewer than $\lfloor (d_t-1)/2 \rfloor$ errors have occurred, $$\left(\tfrac{1}{2}\right)\left({}^{0}\vec{C} - {}^{1}\vec{C}\right)\cdot\vec{R} \geqq d_t - 2\left[\frac{d_t-1}{2}\right] \geqq 1.$$

Thus °C. achieves $$\max_{\vec{C}\epsilon C} [\vec{C}\cdot R]$$

and the value $°c_i$ assigned to each bit will be +1 if the transmitted bit was one, and −1 if the transmitted bit was zero. Since this holds no matter which subcode is at the top of the trees, the final majority vote must give the correct value for each bit.

This same algorithm can easily be modified to take advantage of channel reliability information coming from a binary channel. This is the preferred approach. Rather than loading the registers for a bit with +1 or −1 from a hard decision receiver, the registers can be loaded with the logarithm of the likelihood ratio for one versus zero. Algorithm B will then decode for a maximum likelihood version of the tree bound. A similar algorithm can be advised for a non-binary channel, of course, but it will require more registers for each digit.

An immediate criticism which this algorithm invites is that it requires a maximum likelihood decoder for the subcodes. While this admittedly has dire implications for the complexity resulting from the use of an arbitrary subcode, the requirement is not as bad as it may seem for many recursively-defined codes. First, a maximum likelihood decoder for simple parity check is not complex, and this algorithm can thus be used on any low-density parity check code. Second, for fixed subcodes the complexity of the algorithm grows only linearly in the girth of the graph. Thus, for code based on a very large girth graph, the complexity of the subcode decoder is not a major issue. Finally, it may be possible to get good decoding performance from a similar algorithm which words recursively, namely, the subcode decoding is performed by an algorithm of the same type which computes only an approximation to the true maximum likelihood value of $Z_j - U_j$.

Decoding Complexity

The decomposition of a decoding process into a series of subcode operations requiring only local information guarantees that the asymptotic growth of complexity for a sequence of codes of fixed rate is very low, as will now be shown by deriving upper bounds on the complexity for two specific sequences.

As a first case for analysis, consider the effect of using a single recursive step, basing a sequence of codes on a single subcode and a sequence of graphs of fixed subcode node degree and fixed digit degree but increasing girth. Although the exact rate of the codes depends on the technique for assigning digit positions in each of the subcodes, it can be shown that the rate of any of the codes has a fixed lower bound. For any of these codes then, the number of subcodes in the graph is proportional to the code length. It follows immediately, therefore, that the computational complexity of error detection is 0(N), because detection requires only a detection check by each of the subcodes involving a fixed number of operations. Since the detection procedure admits total parallelism, the time complexity is obviously 0(1).

Now consider error-correcting Algorithm B described above. Each iteration requires a number of arithmetic operations proportional to N. The procedure carried out at each subcode node involves a fixed number of arithmetic operations per node, as does the set of operations carried out at each digit node. Using Gallager's graph construction, the girth of the graph is proportional to log N. If, as is the case for Algorithm B, the number of iterations is held proportional to the girth, it follows that the computational complexity in terms of arithmetic operations is 0(N log N). However, the registers required for the algorithm must store a number of the size of the minimum distance of the code which, for the best possible codes of this form, may grow linearly in N. This could appear to imply that the complexity of each register operation itself grows with N. On the other hand, the values stored in the registers are used only in comparisons with other registers. Consequently, by appropriately scaling the values in all of the registers at each iteration, the comparative accuracy can be maintained up to any desired level with registers of fixed size. The 0(N log N) bound is then preserved. Again, the complete parallelism gives the algorithm a time complexity of 0(log N).

A second avenue to the construction of sequence of codes is to use graphs of the same girth and digit node degree at each stage of recursion and create each new code in the sequence by using an additional recursion. Assuming the lower bound on rate holds at each stage, however, the rate of the base subcode must be increased with the number of stages of recursion to keep the rate of the final code fixed. As a specific illustration, consider forming a sequence using the product code graph which has digit degree two, girth eight, and causes the code length to be squared. Let T(N,P) be the number of operations required to decode a code of length N and redundancy rate P=(N−K)/N using a recursive algorithm similar to Algorithm B. A two-phase process is iterated g/4 times, but here the subcode node decoders themselves make iterated recursive calls to a similar algorithm for the sub-subcodes, on down to the base code. If there are s stages of recursion, $N=n^2$, where n is the length of the base code. The complexity satisfies the recursion relation $$T(N,P) = g/4\left(\frac{mN}{\sqrt{N}}\right)T\left(\sqrt{N}, \frac{P}{m}\right) + cN = 4\sqrt{N}\,T\left(\sqrt{N}, \frac{P}{2}\right) + cN,$$

where cN is the number of operations required for the bit register inerchanges and final votes. Solving for T(N,P) in terms of the base code complexity T(n,p) gives $$T(N,P) = 4^s N^{1-(\frac{1}{2}s)}\,T\left(N^{\frac{1}{2}s}, \frac{P}{2^s}\right) + \left(\sum_{i=0}^{s-1} 4^i\right) cN$$

-continued $$\leq 4^{log\left(\frac{logN}{logn}\right)} \frac{NT}{n}\left(n, \frac{P_{logn}}{logN}\right) + \frac{4^{log\left(\frac{logN}{logn}\right)}}{3} cN$$

$$\leq \frac{(logN)^2}{(logn)^2} N\left[T\left(n, \frac{P_{logn}}{logN}\right)\frac{1}{n} + \tfrac{1}{3}c\right]$$

If the lower bound on rate is satisfied at every stage of recursion, the base subcode used for the successive constructions must have a rate increasing toward one. For instance, when the base subcodes are binary Hamming codes decoded with a probabilistic decoding algorithm which requires $0(n^2)$ operations, the ultimate complexity can be derived as follows: (For a Hamming code p=logn/n)

$$\frac{P_{logn}}{logN} = \frac{logn}{n}, \text{ so } n = \frac{logN}{P}, \text{ and } logn = loglogN - logP$$

$$T\left(n, \frac{P_{logn}}{logN}\right) = T\left(n, \frac{logn}{n}\right) = 0(n^2) = 0\left(\frac{(logN)^2}{P^2}\right)$$

Therefore, for fixed P, $$T(N,P) \leq \frac{(logN)^2}{(loglogN - logP)^2} N\left(O\left(\frac{(logN)^2}{P^2}\right)\frac{P}{logN} + \tfrac{1}{3}c\right)$$

$$T(N,P) = O\left(\frac{N(logN)^3}{(loglogN)^2}\right)$$

Again the parallelism ensures that the time complexity of this process is no worse than $0(logN)^3/loglogN)^2)$.

By using graphs of larger girth in the same type of recursion, the exponent of the log N factor can be reduced. Furthermore, all of the operations are of the same form, namely, repeated operations carried out by the base code processors and digit processors. The complexity of the machine architecture of the decoder lies not in the actual computations but in the data movements or wiring that allows the processes to access the appropriate subsets of the data.

An Example

Many of the foregoing teachings can be illustrated with a two-stage recursive construction of a [55,11,18] code starting from a simple parity check base code. The graph used for each stage is a bipartite graph constructed from a simple complete graph.

Figure 19:
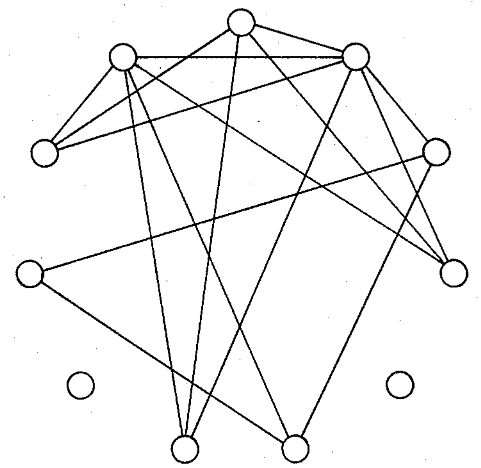
FIG. 19 is a graph of a minimum weight 18 word as associated with the graph of FIG. 17.
Figure 17:
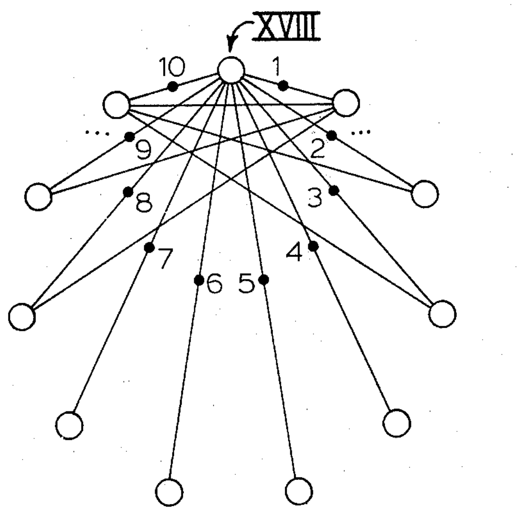
FIG. 17 is a complete graph on eleven nodes employing identical subcode nodes being a complete graph on five nodes.
Figure 18:
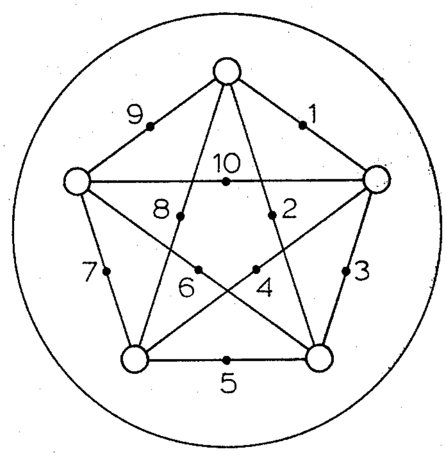
FIG. 18 is the complete graph of five nodes employed at the nodes of the graph of FIG. 17 as typified by the node shown by the arrow XVIII.

Starting from a complete graph on five nodes, a bipartite graph is created by inserting a bit node in the middle of each edge, as shown in FIG. 18. Each of the original nodes can be viewed as a subcode node checking four bits. Let each of these subcodes correspond to a simple parity check. The result is the standard [10,6,3] graph code. The tree bound for this simple construction guarantees minimum distance 3, the true distance. The lower bound on the rate of the code is ½, but one of the parities is dependent. Now use this code as the subcode in similar construction starting from a complete graph on 11 nodes as shown in FIG. 17. For simplicity, all the edges are not shown. The new graph has $$\binom{11}{2} = 55 \text{ bit nodes,}$$

and each subcode checks 10 bits. Because the subcode has minimum distance 3, the tree bound guarantees a minimum distance of at least 6 for the new code, no matter how the positions of the 10 bits checked are assigned in the subcode. The particular assignment used for the top subcode is shown in FIG. 17. The 10 bits checked by that subcode (labelled 1 throuth 10 in the eleven subcode node graph) are given the positions labelled 1 through 10 in the graph for the subcode. The assignments for the other subcodes are then determined by cyclic symmetry in the large graph. The assignments for any subcode can be determined by rotating it to the top subcode position. The minimum distance of the new code, determined by computer, is 18, far surpassing the tree bound. A minimum weight 18 word is shown in FIG. 19.

A variety of encoders for the code can be constructed. The principles underlying three different versions will now be discussed briefly. The space of codewords is spanned by the ten cyclic shifts of the word shown in FIG. 19 plus the all ones word. Another basis for the space is the set of eleven cyclic shifts of a word that has only one of the outermost bits non-zero (e.g., the bits labelled 1 and 10 in FIG. 17). The outermost bits thus constitute an information set for the code. The first encoder, somewhat analogous to an encoder for a normal cyclic code based on the generator polynomial, simply adds a one into every parity bit which is one in the basic vector when the corresponding information bit is one. For this particular code, this would be a cumbersome architecture, requiring four eleven bit shift registers to store the parity bits and a large number of adders. For similar codes of higher rate, it could be more advantageous.

A second encoder can be derived from the idea of propagation of a solution via subcode encodings. Since this code is a two-stage recursive construction, the concept of a propagating solution can be carried down to the original parity checks. Referring to FIG. 17, suppose the outermost eleven bits are given. Suppose the values for the bits on the second tier (e.g., bits 2 and 9) are computed using some general technique. Now consider the subcode diagram. Since bits 1, 10, 2 and 9 are known, the top parity check alone determines bit 8. Similarly, in another subcode a single parity check determines bit 3. But this implies that bit 4 can be determined, and another subcode gives bit 7, which in turn allows 6 and then 5 to be computed. A parallel implementation of this strategy can compute the codeword in 5 steps.

The third encoder suggested is analogous to the parity check polynomial encoder for a standard cyclic code. Suppose the information bits have been loaded into an eleven bit cyclic shift register. Any bit on the second tier can be computed by summing a subset of the information bits in the cyclic register. Since the graph has cyclic symmetry, all the second tier bits can be computed by cyclically shifting the register. The bits of the remaining three tiers can be obtained in a similar manner by using three different summing circuits connected to the appropriate stages of the information bit shift register. Clearly, the codeword can be computed five bits at a time with an encoder requiring only eleven bits of memory and four different summing circuits.

Figure 20:
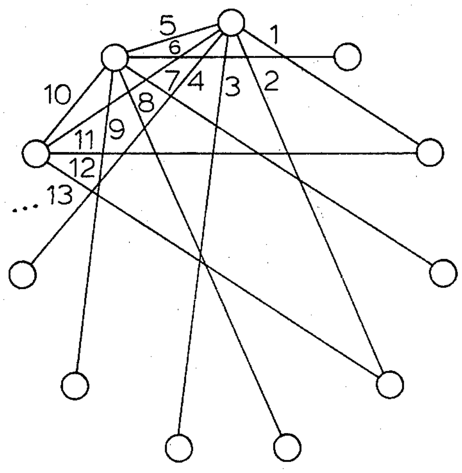
FIG. 20 shows a transmission order to be employed with the graph of FIG. 17 to maximize the ability to correct burst errors.

A good transmission order for enhancing the code's effectiveness against burst errors is shown in FIG. 20. It is easy to see why bursts will tend to be corrected. For any burst of length eleven or less, most of the errors appear as single errors in separate subcodes.

A modified version of Algorithm B was implemented and tested on a general purpose computer. Rather than decoding at the subcode level, the algorithm works only at the sub-subcode level, that is, on the parity checks themselves. Each of the eleven subcodes is built on a graph using five parity checks. Interpreted at this level, there are 55 parity checks each checking four bits, and 55 bits each checked by four parities. The two phase algorithm used four registers for each bit. All four were loaded with a +1 if the bit was a one, −1 if the bit was a zero. In the subcode phase, the four registers of the bits checked by a parity were updated according to $$R_1' = R_1 + \mathrm{sgn}(R_2)\mathrm{sgn}(R_3)\mathrm{sgn}(R_4)\min(|R_2|,|R_3|,|R_4|)$$

In the bit phase, the four registers for the bit were updated according to $$R_1'' = \left[\frac{R_2' + R_3' + R_4'}{2}\right]$$

After a specified number of iterations, the output value of a bit was determined by the sign of the sum of the associated registers, 1 if the sum was positive, 0 if the sum was negative.

By testing the algorithm against five consecutive shifts of each burst error pattern containing i errors, i=1,2, . . . ,11, it was determined that the algorithm will correct all bursts of length eleven or less. Preliminary testing against random errors indicated that the same algorithm will correct any pattern of seven or fewer errors and many of greater weight. All weight 6 error patterns tested were decoded in five or fewer iterations. One weight 7 required 22 iterations. The same algorithm can incorporate channel reliability information by loading the bit registers with the log of the likelihood ratio for the bit, but its performance has not been specifically tested to date.

One-dimensionally Infinite LCR Codes

The codes thus far considered have been block codes. The same underlying principles can be realized in a one-dimensionally infinite form analogous to that of standard convolutional codes (see, e.g., Peterson and Weldon, Supra, Chapt. 13). The one-dimensionally infinite codes may have some advantages over the block codes for encoding a continuous stream of message digits. The specification of the codes parallels exactly that of the block codes.

Graphs

Once again, the codes are based on bipartite graphs which carefully structure interdependencies between the encoded digits while maintaining a low complexity. Rather than finite graphs as before, these graphs have the same local properties of the finite graphs (i.e., the paths leading from a node reach as many nodes of the graph as possible before creating a cycle), but they are infinite in one dimension. This infinite dimension corresponds to the infinite sequence of message digits to be encoded, and will be called the time axis.

Figure 21:
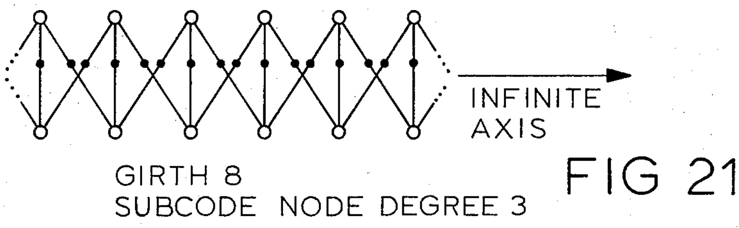
FIG. 21 is an infinite graph corresponding to the finite graph of FIG. 10(*b*).
Figure 23:
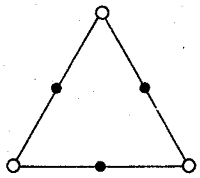
FIG. 23 is a cross-section through the graph of FIG. 22 in the plane XXIII—XXIII.
Figure 22:
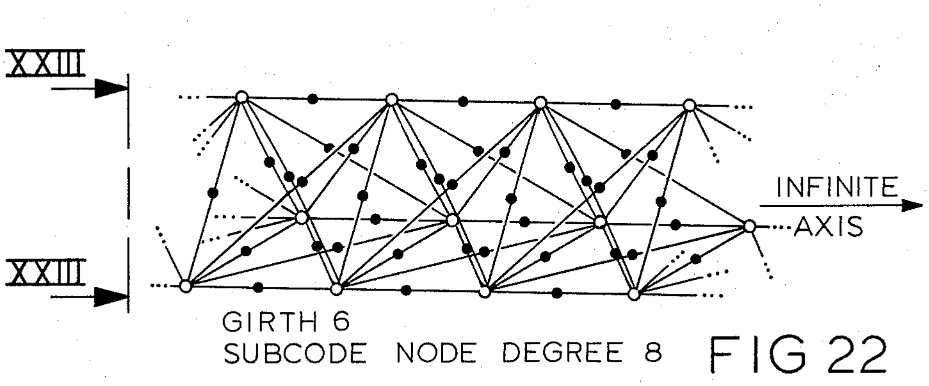
FIG. 22 is a more complete infinite graph.

Many simple versions of infinite graphs can be derived by simple extension of the finite graphs. For example, a finite graph of the form shown in FIG. 10(*b*), becomes the infinite graph shown in FIG. 21. A more complicated extension of a finite graph to an infinite one is given in FIGS. 22 and 23. Here, a simple bipartite graph with three subcode nodes is used as the cross section of the infinite graph. Copies of the simple graph are lined up along the infinite dimension and then interconnected with additional digit nodes in a way that preserves the girth of the graph. In this particular case, each copy has been connected only with the one before and the one after, but generally, in more intricate constructions, the connections may be spread much further in both directions along the time axis.

As for the block codes, the set of code sequences is now defined by associating a block subcode with each of the subcode nodes of the graph and imposing the condition that the digits adjacent to each node must satisfy the subcode constraint.

The novel codes defined in this way can be distinguished from existing convolutional codes by the restriction that not all subcodes in the graph are simply parity check codes on some field of elements.

Assignment of Subcode Digit Positions

As with the block codes previously described, to complete the specification of the one-dimensionally infinite code, the role that each digit plays in its adjacent subcodes must be established. Normally the assignment pattern will have at least some periodic regularity along the infinite axis, and it will typically have further simplifying symmetries on each cross section as well. The particular assignment determines both the rate and the quality of the code. The tree bound derived for block codes can again be used to guarantee that none of the codes are of very poor quality. Difference sequences must be encoded as sequences which differ in at least the number of places indicated by the bound. Most assignments will lead to codes with an effective distance much greater than that assured by the bound.

Encoding

The encoding process for these infinite LCR codes is fundamentally no more difficult than for the block versions. It can be thought of as proceeding along the time axis, one cross section at a time. The subcode constraints of the previous time planes (or cross sections) will have already determined a certain fraction of the digits entering into the current subcode relations. An additional fraction will be available as information digits to be given values from the message sequence. The remainder of the digits must then be computed from the subcode equations, using techniques such as those suggested for block codes. Once all the digits adjacent to the current subcodes have been fixed, they and similar digits from previous time planes are passed on to the next subcode plane.

Figure 24:
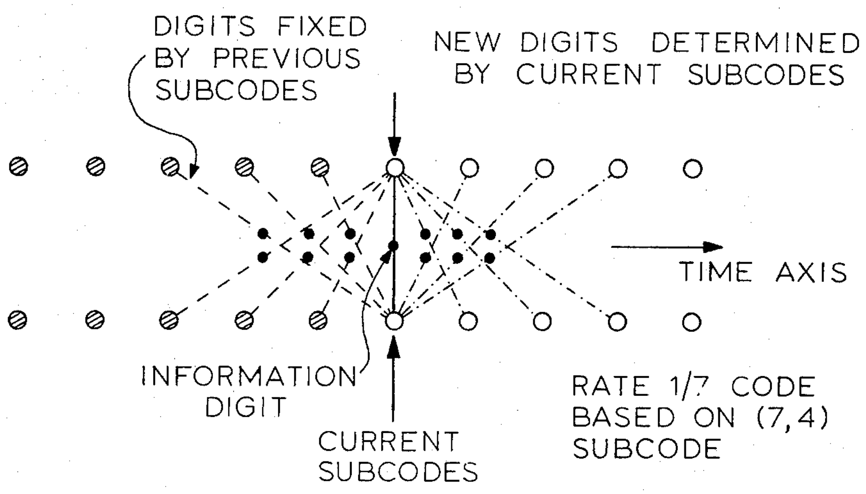
FIG. 24 depicts the procedural form for a one-dimensionally infinite code.

An illustration of the procedural form is given in FIG. 24 for a one-dimensionally infinite code based on a Hamming (7,4) subcode. The diagram implicitly assumes that the particular assignments of bit positions is such that the three bits connecting to the right along the axis can be used to solve the subcode constraints. If so, the bit node connected to the two current subcodes can be used as an information bit. Note that the bipartite graph for this code is of the same basic form as that of FIG. 21. Subcode nodes already processed are shown crosshatched; those not yet visited are unfilled. For the assignments leading to maximal independence of the code constraints, only one bit out of every seven is available for information. The code will thus have a rate of 1/7.

Transmisson Order For The Digits

The transmisson order for the digits is generally implied by the time axis. Within the flexibility allowed by the memory limitations of both the encoder and the decoder, it is possible to choose the order so as to make the code more effective against the particular error tendencies of the channel. As it was the case for block codes, the successively transmitted digits can be spread out over the subcodes in the current and previous time planes in a way that makes burst errors easily correctable by the decoding procedure.

Decoding

All of the essential features of the various decoding procedures described for block LCR codes carry over directly to the infinite versions. Again low complexity of effective decoding is obtained through decomposition of the process into repeated operations at each of the subcode nodes.

Detection

On each successive time plane of the code, a detection procedure is run for every subcode in the time plane. An error is detected when any of the subprocessors detects an error.

Correction

Within each time plane, a one-dimensionally infinite LCR code looks like a block LCR code. Consequently, the decoding procedure can be considered as an extension over the time planes of any of the decoding procedures previously defined for the individual time planes. What remains to be specified, is the sequencing and coordination of the decoding operations at every subcode node in the infinite graph.

Because of the cost of memory, practical implementation will tend to require that the number of time planes involved in computations yet to be performed be confined to the smallest possible interval along the time axis. This suggests a very natural form for the parallel and simultaneous subcode operations of Decode Procedures One and Two which can serve as one example of possible subcode coordinations.

The decoder may be thought of as a large cylindrical section that travels step by step down the time axis. Every subcode that is within the cylinder is simultaneously decoded employing the outlined procedures and using the information stored at every digit node adjacent to the subcode. The digits which have already passed through the cylinder and, therefore, will be involved in no future computations, are ready for emission to the message sink. The final estimate or output form for the digit can be generated from the contents of the registers associated with that digit, which should normally give a consistent indication of the digit's value. The number of times each subcode node is processed depends on the length of the cylinder, which is analogous to the number of iterations prescribed for the block LCR codes. The cylinder length is, therefore, normally a function of the girth of the graph and the span of the digit nodes connecting each subcode to subcodes on other time planes.

Figure 25:
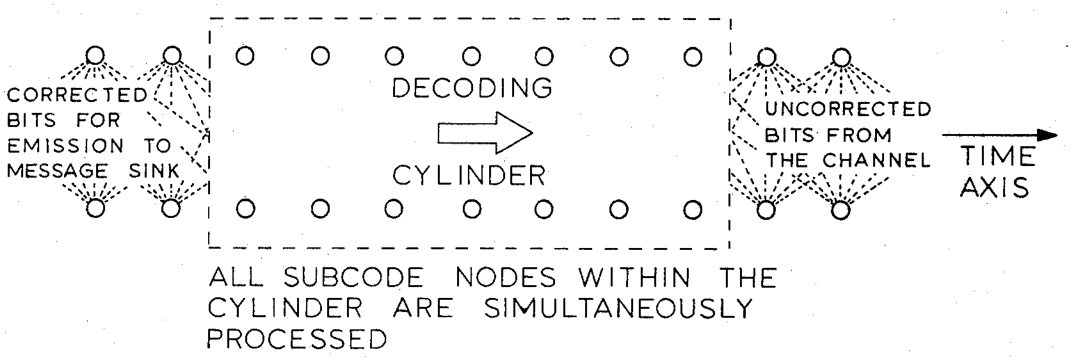
FIG. 25 is a graphical interpretation of a decoding process for the code of FIG. 24.

FIG. 25 gives a graphical interpretation of this process for the code of FIG. 24. The decoding cylinder is of length seven, matching the time span of the subcode dependencies. Fourteen subcode nodes, seven on top and seven on bottom, are simultaneously processed. Each subcode node is processed seven times as the cylinder passes over it.

Additional Recursion

The full recursion possibilities mentioned for block LCR codes also have a counterpart for the infinite structures. Any one-dimensionally infinite LCR code (or conventional convolutional code, for that matter) defines a set of relationships between digits on a series of time planes. One can then take a finite graph of the block LCR code type and look at one particular subcode node in the graph, consider all the digit nodes adjacent to that node, and make an infinite number of copies of the graph along the time axis. The set of adjacent nodes in all the copies form an infinite sequence. That sequences can then be required to satisfy the constraints of some appropriate one-dimensionally infinite LCR code. Applying a similar condition to all the nodes leads to a new LCR code.

This construction is the natural extension of the fully recursive block construction. It would be necessary only for tremendously large codes.

An Illustrative Embodiment

The various principles and possibilities discussed above will now be illustrated by the construction of an LCR block code of length 28 from the linear (7,4) binary Hamming code used in several previous examples. This code has minimum distance three.

The bipartite graph for the construction is the complete graph on eight nodes analogous to the graph of FIG. 9. There are eight subcode nodes, each of degree 7, and $$\binom{8}{2} = 28 \text{ bit nodes,}$$

each of degree two. (See FIGS. 26–29). The bits have been numbered with arabic numerals, the subcodes with Roman numerals. Since there are 7! possible bit position assignments in every subcode, there are potentially $(7!)^8$ different assignments, many of these equivalent. This choice has been reduced for the code shown by requiring that the assignment pattern in the circular graph have circular symmetry. The assignment for any node can be obtained by rotating that node to the top of the graph to take the place of subcode node I. Then the positions are assigned according to the typical pattern shown. This symmetry reduces the number of possibilities down to 7!, which, in turn, can be shown to divide into 15 equivalence classes.

The particular assignment illustrated is one which maximizes the rank of the H matrix of the LCR code. The actual H matrix for this assignment is represented in FIG. 29. Corresponding to each subcode are three rows of the H matrix, or equivalently, a 3×28 submatrix. Only seven columns of each submatrix are nonzero, those columns being the permutation of the columns of the Hamming code matrix, $H_s$, of FIG. 27 specified by the letter column labels. Since the H matrix has 8·3=24 rows, if the rows are all independent, the code must have 28−24=4 information bits. It has a minimum distance of 13. The calculation of rate for this code suggests a general result which holds for linear codes: The rate of the maximal rank LCR codes based on graphs of fixed subcodes and digits degrees is a constant, independent of code size.

Figure 30:
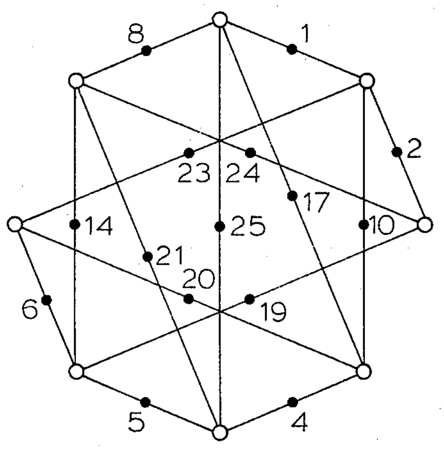
FIG. 30 is a typical codeword.

FIG. 30 depicts a typical codeword—all the bits with value zero have been suppressed in the drawing. This codeword and its rotation by 45°, 90°, and 135° span the space. Bits 25, 26, 27, and 28 can be taken as information bits, and the rest are then determined by the code constraints.

Other configurations with subcode assignment circularly symmetry give as many as 9 information bits and minimum distances as low as six. Other codes with different subcode symmetries have been investigated, and some appear to have properties better than those of the best known codes.

The tree bound for this code is 3+3=6. For this graph, any assignment must lead to a minimum distance of at least 6. Any non-zero subcode must have at least three ones, the minimum distance for the subcode. This implies that there are three more non-zero subcodes, which in turn implies that there must be at least $$\frac{\text{(non-zero subcodes) (ones per subcode)}}{\text{bit node degree}} = \frac{4 \times 3}{2} = 6$$

ones in the LCR code.

Figure 31:
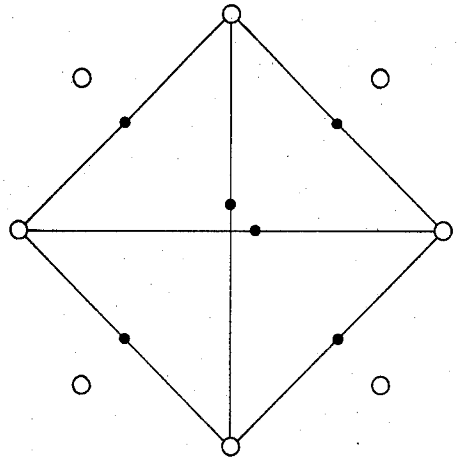
FIG. 31 is an example of a codeword.

An example of such a codeword is given in FIG. 31.

Encoder

Figure 32:
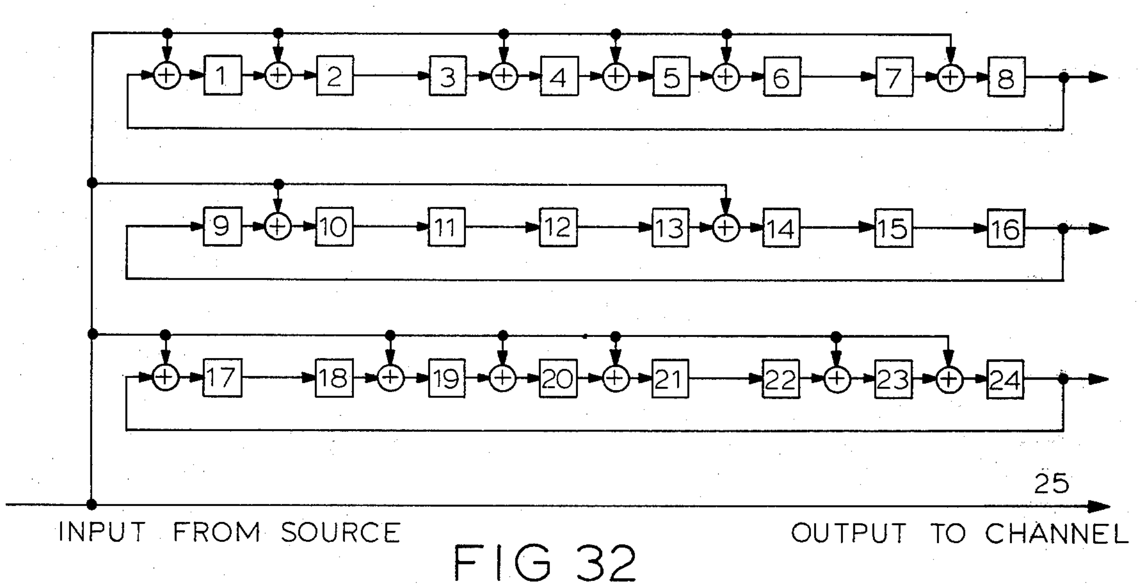
FIG. 32 is a shift register encoder for the example code of the illustrative embodiment.

A shift register encoder for the example code is shown in FIG. 32. Although a code of such simplicity could be encoded about as simply through direct addition of a basis set of codewords, the encoder here demonstrates a generalizable circuit with as many shift register stages as there are parity checks in the LCR code. The input from the source is the four successive information bits, numbers 25, 26, 27, and 28. The numbers on the shift register stages indicate the bit position number of the bit stored by that stage at the time bit 25 is entered. All stages are set to zero at the start of the encoding. After all information bits have been entered, the correct parity checks are stored in the cyclic registers, with bit number 4 available at the top register, 12 at the middle register, and 20 at the bottom register. Note that the connections from the input to the shift registers correspond to bit positions of the ones in the codeword of FIG. 30. A code lacking the circular symmetry would require more complicated connections.

Transmission Order for Burst Error Correction

Figure 33:
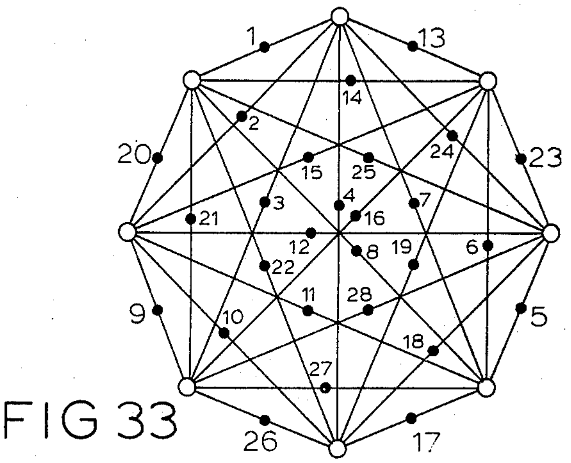
FIG. 33 is the graph of FIG. 26 with the bit nodes labeled to indicate an appropriate transmission sequence.

Since the example code has a minimum distance close to optimal for random error correction, there is very little flexibility left to bias the correction capability toward burst errors. For the other codes of this class with higher rate and smaller minimum distance, however, careful choice of the transmission order can enable the codes to correct burst errors far beyond the number of correctable random errors. FIG. 33 presents the same graph with the bit nodes labeled to indicate an appropriate transmission sequence. With this order, any burst of length six will be corrected by any code in the class using Decoding Procedure Two, even those with minimum distance six. Procedure Two in this case should specify that a bit is changed if either of the two subcodes checking it find it to be the most likely single error within that subcode (i.e., the bit change needed to make the subcode syndrome zero).

Figure 34:
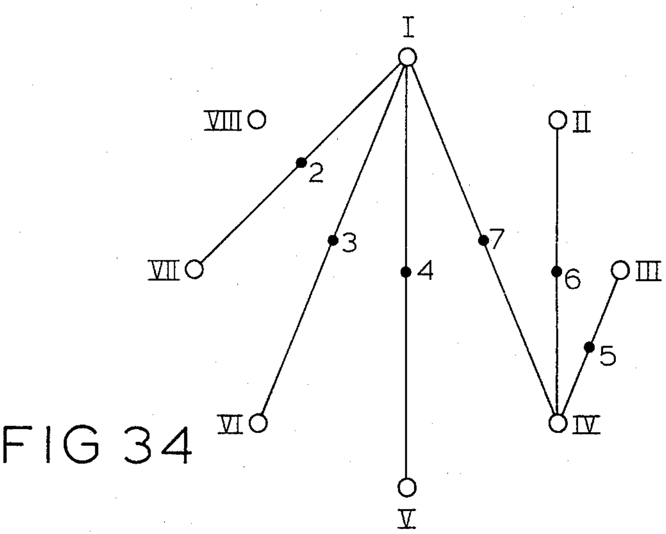
FIG. 34 depicts a typical correctable burst.

A typical correctable burst is shown in FIG. 34. On the first iteration of the decoder, subcodes II, III, V, VI, and VII will cause bits 6, 5, 4, 3, and 2, respectively, to be corrected. Since no four columns of the Hamming code H matrix can be independent, the bits in error at subcode I must contain a codeword, and consequently, subcode I may also cause one of the bits 2, 3, 4, or 7 to be corrected. In any event, it will create no new error. On the second iteration, then, there can be at most two remaining errors. They will necessarily both be corrected but may cause one new error. On the third iteration, this final possible error will be corrected.

Decoder

Figure 35:
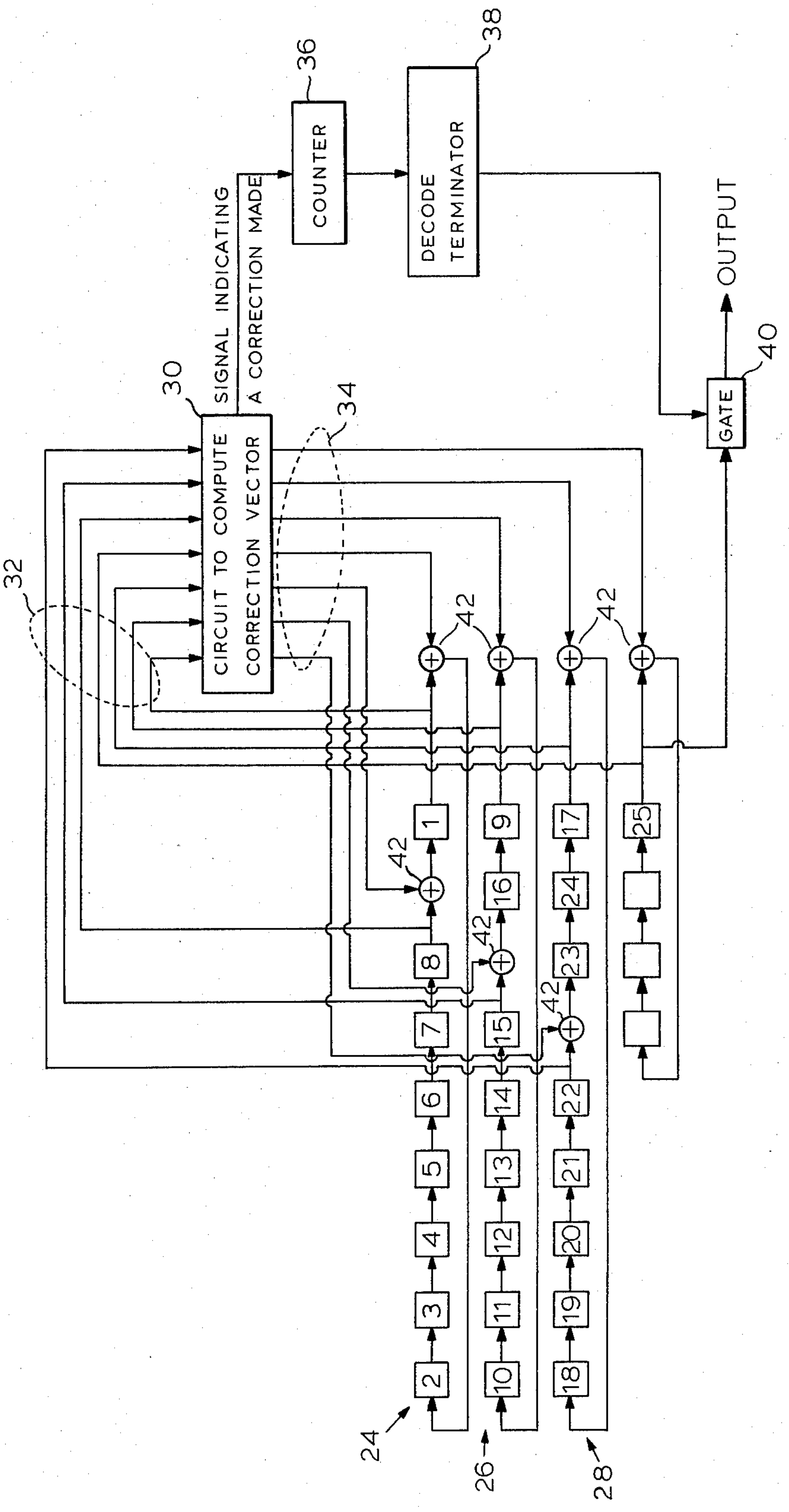
FIG. 35 is a circuit to execute Decoding Procedure One.

A circuit to execute Decoding Procedure One is shown in FIG. 35. The three cyclic shift registers 24, 26, 28 of eight bits correspond exactly to the three shift registers of the encoder in FIG. 32, and they should be loaded with bits received from the channel in the same relative positions. With the bits positioned as indicated, the circuit is ready to perform the corrections corresponding to subcode I. After one shift of all the registers, the circuit will be correcting for subcode VIII, followed by subcode VII after an additional shift, and so forth around the circular graph.

The box 30 containing the circuit to compute the correction vector has the function of accepting a sequence of seven bits through the lines 32 entering the top and computing the needed correction for the bits to meet the Hamming Code constraint. The value on the bottom line 34 leading back to the bit needing correction, if any, is then made 1. The rest of the bottom lines 34 remain 0. For example, a combinatorial circuit of logical gates, or a Meggitt decoder with its own shift register can be used. Every time a correction is made, the box 30 must also send a signal indicating the correction to a counter 36.

The "counter" box 36 has the function of recognizing when the decoding is completed or that a prescribed limit to the number of iterations has been reached. This can be accomplished by its incorporating two counters, one of which is reset to 0 every time a correction is made, the other of which counts the total number of iterations. If ever the first counter reached 8, it means that all subcode relations are satisfied and the decoding is finished. Similarly, if the iteration counter exceeds its prescribed limit, the decoding should be terminated and either the current estimates of the information bits output, or a decoding failure indicated.

The decoding terminator 38 has the function of simply shifting the information bit register back to the correct order and opening the gate 40 to let the bits be passed out to the message sink.

A decoder of almost exactly the same form can be used for error detection. The circuit to compute the correction vector in box 30 is replaced by a simple detection circuit for the Hamming code, and the correction lines 34 and mod 2 adders 42 deleted. The counter needs only verify that eight shifts of the registers are successfully completed without any errors being detected.

To implement Decoding Procedure Two, the circuit must be modified so that the corrections indicated by the correction circuit are fed into additional shift register memory so that the original bits can be input to both subcodes checking each bit before any changes are made.

For Decoding Procedure Three, the simple shift registers 24, 26, 28 must be replaced by registers carrying not just bits, but more complicated representations of the bit error probabilities. The circuit to compute the correction vector of box 30 is replaced by a special purpose computer with a small separate memory which carries out the procedure previously outlined. In practice, the bit probability statistics themselves may be stored in the random access memory of the computer.

COMPARISON WITH EXISTING CODING METHODS

Since the codes and techniques of the present invention represent a new approach to the entire coding problem, rather than an improvement within the framework of a well-established technique, it would be possible to offer comparisons with virtually all the major schools of coding practice. However, the discussion hereinafter is restricted to representative codes which are either in some way conceptually proximate, or potentially competitive in some commercial environment. The codes to be considered are Elias' product codes, Gallager's low density parity check codes, majority logic decodable codes (e.g., Peterson and Weldon, Supra, Chapt. 10), Bose-Chaudhuri-Hocquenghem. (BCH) codes, and convolutional codes. The three attributes to be used to differentiate the LCR codes of the present invention from each of these are code quality, code generality, and, perhaps most importantly, computational complexity.

Product Codes

Elias' product codes were the first codes for which the probability of error could be shown to go asymptotically to zero for a non-zero rate code. Virtually all non-trivial LCR codes will have this property as well. The product code construction is recursive—a longer code is derived from a combining of shorter subcodes. They are also complexity—for a fixed subcode, the complexity of both encoding and decoding grows as N log N. Given these properties, it is not altogether surprising that they are a special, limited version of LCR code. Indeed, they are about the weakest possible codes with the weakest decoding procedure of the general class of LCR codes described herein.

Figure 36:
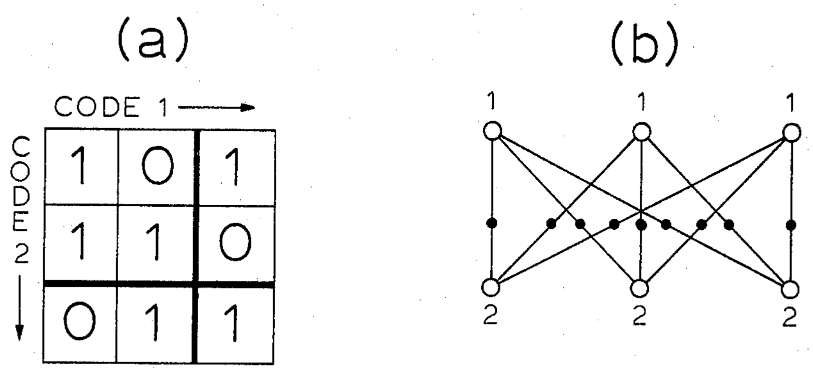
FIG. 36(*a*) and 36(*b*) illustrate the correspondence between the product and the graph for a simple parity check product code.

The product of two codes is a rectangular array of digits where the rows must all satisfy the constraints of the first code, and the columns the constraints of the second code. This construction can be represented in terms of a bipartite graph with girth eight and diameter four, and thus the product fits the definition of an LCR code. FIGS. 36(*a*) and 36(*b*) illustrate the correspondence between the product and the graph for a simple parity check product code. The critical noteworthy feature of this product is, however, that the digit position assignment implicit in the product specification is the weakest possible. The resulting code satisfies the tree lower bound on minimum distance. Any other LCR code based on the same graph and the same subcodes is guaranteed to have at least the minimum distance of the product code, and almost all will have much superior minimum distance.

Figure 37:
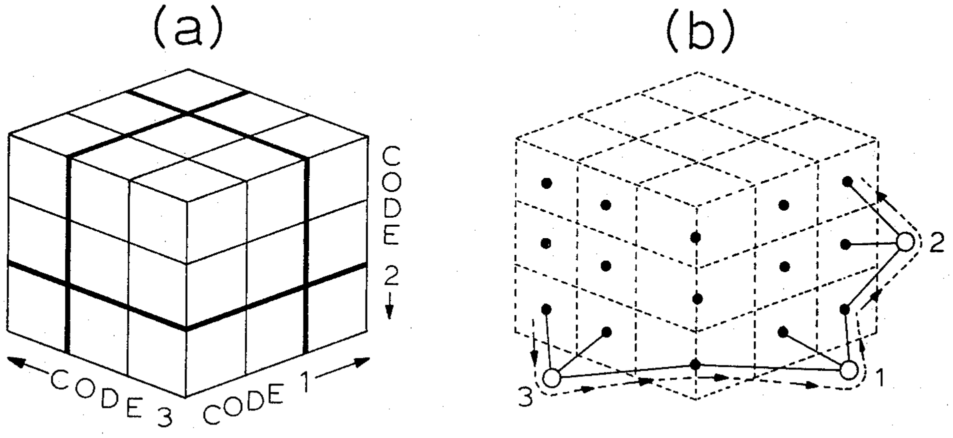
FIGS. 37(*a*) and 37(*b*) illustrte a dificient graph constructed to the specifications of a product code.

To obtain longer product codes, the same idea is used recursively. The next step is a product of the first product code and another subcode, which again is allowed by the recursive definition of LCR codes. On the other hand, it would seldom be recommended at this stage, because, in effect, it leads to a deficient graph when viewed as an LCR construction based on the original subcodes. The associated graph still has girth eight, but it has diameter six, as illustrated by the parity check code example in FIGS. 37(*a*) and 37(*b*). Repeated recursions lead to larger and larger graph diameter with no growth in girth.

Another aspect of the difference between the product construction and the desirable LCR constructions can be underlined by considering what happens when a fixed subcode is used. With a fixed subcode, repeated products yield codes whose rates tend monotonically to zero. Using the graphs of generalized polygons, the same fixed subcode will lead to LCR codes of fixed rate, with minimum distances guaranteed to be at least as good as those of the same length product code.

The decoder proposed for product codes is a special instance of Decoding Procedure One. It is not difficult to show that it will be strictly inferior to either of the other two decoding procedures outlined, even for the same code.

Low Density Parity Check Codes

Gallager's low density parity check codes are linear codes of a special form. The H matrix for the code must have the same number of non-zero entries in each row, and the same number of non-zero entries in each column. By interpreting each row as a simple parity check subcode, the bipartite graph corresponding to such a code can be formed. It has the special feature that all of the subcode nodes have the same degree (the number of non-zero entries in a row), and all of the digit nodes have the same degree (the number of non-zero entries in a column). Thus, they too can be viewed as a special case of LCR codes. So-called "graph codes" are a special case of low-density codes, those with digit node two, and are a further restriction of LCR codes.

There are two distinguishing features which separate the preponderance of interesting LCR codes from these low-density codes. The first is that in low-density codes, all of the subcodes are simple parity check codes. The second is that the H matrix constructions suggested in Gallager's original work correspond to graphs much inferior to those proposed earlier for LCR codes. Because a parity check code has minimum distance two, the tree bound for these codes is just one half the girth of the bipartite graph, and will be the actual minimum distance of the low-density code, whenever digit nodes have degree 2. Moreover, Gallager's matrix construction guarantees graphs with only half the girth provided by the better graphs mentioned here. Consequently, the prescribed low-density codes are exceedingly weak.

All three of the basic decoding procedures suggested for LCR codes can be viewed as generalizations of and improvements on the specific narrow decoding methods proposed by Gallager for low-density codes. One critical difference is, of course, that his methods are applicable to parity-check subcodes only.

The desirable similarity between LCR codes and low-density codes is the computational complexity and the ability of the decoder to incorporate effectively channel reliability information. It has been rumored that Russian researchers have shown the asymptotic complexity of Gallager's code to be the lower bound on decoding complexity. If so, LCR codes, which have the same asymptotic complexity order as low-density codes may prove to be an optimal class.

Majority Logic Decodable Codes

Majority logic decodable codes are extensions of a theme suggested by Gallager for decoding low-density codes—decoding based on simple threshold decisions calculated on the "votes" of statistically independent digits. The key concept for the success of majority logic decoding is "orthogonality", referring to the ability of some group of digits to provide independent information about another digit or linear combination of digits.

The LCR codes built from the suggested graphs have a similar feature in that all of the digits in the code provide independent information on each digit in the code via the shortest paths connecting them. The subcodes may be viewed as a generalization of the orthogonal parity check sums prominent in the theory of majority logic decodable codes. The probabilistic decoder for LCR codes has no counterpart known to the applicant herein.

Bose-Chaudhuri-Hocquenghem (BCH) Codes

In this class of codes, algebraic structure is used to define codes of guaranteed and good quality minimum distance and an exact computational procedure for decoding the number of correctable errors implied by that minimum distance exists. Furthermore, it is of reasonable complexity. It is an important class of codes because it furnishes constructions for almost any length and rate.

Figure 38:
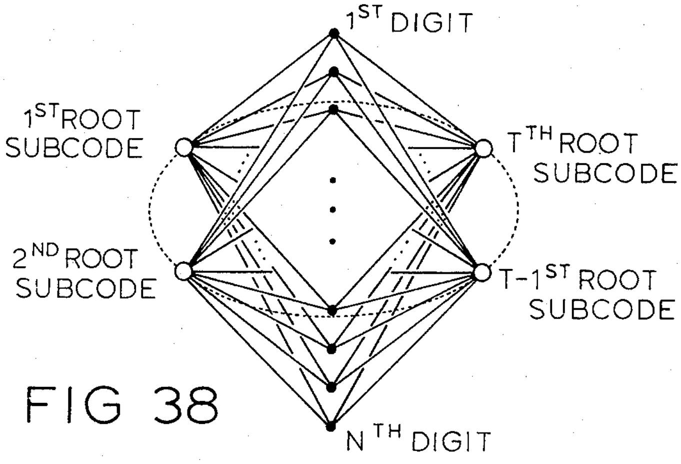
FIG. 38 is a graph of the general form of interpretation of BCH code.

These codes, as well, can be represented in terms of a bipartite graph with subcodes checking digits, although it is less instructive to do so than in the previous cases. All of the graphs have diameter two and girth four. Each of the roots of the generator polynomial of the code imposes a new subcode relation on the same set of digits. A simple example of the graphical representation of a BCH code is given by the assignment diagram of FIG. 14. There, the assignment of subcode one corresponds to the primitive root of the field, and the assignment of subcode two to the cube of that root. The general form of the interpretation is given in FIG. 38. Note that the length of the subcodes is the same as the length of the BCH code.

The decoding procedure for BCH codes differs greatly from that of LCR codes. The most elegant procedure involves an exact computation of complexity roughly proportional to $$D^2 min \log D_{min}'$$

where $D_{min}$ is the minimum distance of the code (see Berlekamp, E. R., *Algebraic Coding Theory,* McGraw-Hill, New York, 1968, Chapt. 7). The number of computations is relatively fixed, independent of the actual number of errors which occurred. As the codes are presently understood, reliability information can only be incorporated via a selective erasure procedure, Forney's generalized minimum distance decoding (Forney, G. D. Jr., *Concatenated Codes,* Research Monograph No. 37, M.I.T. Press, 1966, Chapt. 3), which increases the complexity by another factor proportional to code length.

Although for short and moderate code lengths BCH codes are among the best known for random error correction, it has been shown that for the long length codes, the minimum distance of the codes starts falling off from the theoretically possible values and eventually it goes to zero compared to code length.

By contrast, the LCR codes of primary interest correspond to graphs of diameter greater than two and have lengths much greater than the lengths of the constituent subcodes. The average number of computations to decode grows only slightly faster than linearly in code length, and the number of computations to decode is roughly proportional to the actual number of errors. Furthermore, although the minimum distance assured by the tree lower bound also goes to zero compared to code length, there is good reason to believe that most of the LCR codes have excellent distance structure. For long codes, their quality is probably superior to BCH codes.

Convolutional Codes

For many applications involving the transmission of a continuous stream of message digits, convolutional codes are now preferred in the art. The structure of these codes enables them to take advantage of the continuous nature of the transmission to offer performance superior to that of block codes of comparable complexity. Furthermore, one of their strong attractions is the existence of an optimal decoding algorithm, the Viterbi algorithm, which can make use of reliability data.

Unfortunately, this algorithm requires maintenance and update of a table of stored values representing the likelihood of all possible encoder states. This table, and the attendant computation, grows exponentially with the size of the generator. Consequently, the procedure is practical only for codes with relatively little encoder storage.

LCR codes, both the block codes and the one-dimensionally infinite versions with the specified decoders, have no such exponential growth limitation. Consequently, they can offer a wider range of codes of different rates and longer lengths which can still be effectively decoded using reliability information. Although the potential optimality of the decoding procedures of the form proposed here for LCR codes is an unresolved question, the ability to use codes of greater effective length should in any event permit superior performance in many applications.

PREFERRED MODE OF IMPLEMENTATION

In addition to the advantages hereinbefore described with respect to the LCR code and the method of implementation, the present invention also provides advantages of flexibility and potential low cost in implementation not found in any other coding scheme.

It is known in the art how to implement hardware encoders and decoders for a specifically defined code. That is, having described the algorithm, those skilled in the art can fashion appropriate encoding and decoding hardware circuits. If the code is redefined, however, the procedure must be completely redone and a new set of hardware circuitry produced for the newly defined code. This, of course, does not lead to flexibility or low cost.

By contrast, with particular reference to FIGS. 17 and 18, it will be remembered that the present code is defined employing a graph structure. If, as shown in FIGS. 17 and 18, the bipartite graph defining the code is structured of nodes each being identical subcodes, flexibility and low cost can be easily achieved. The subcode of each node can employ a subcode for which encoding and decoding circuitry in the form of integrated circuits or chips already exist. On the other hand, the design of a new circuit becomes a onetime occurrence. To implement any particular code, the problem is merely one of interconnecting the proper number of circuits for the nodes as defined by the graph.

Figure 39:
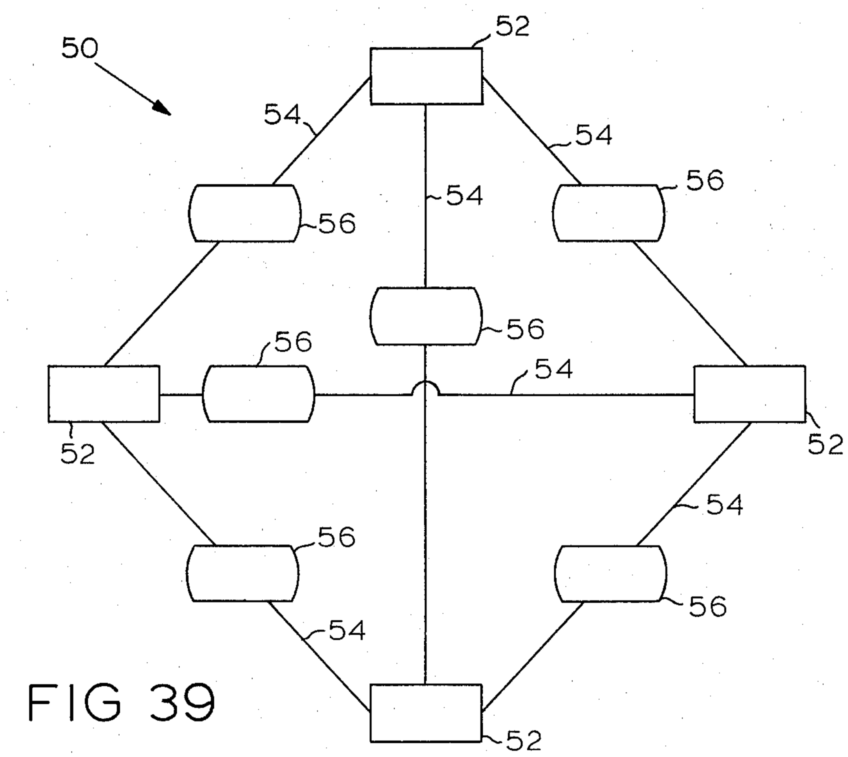
FIG. 39 is a simplified drawing of the preferred method of implementing circuits according to the present invention.

Referring to FIG. 39, a simplified drawing is shown depicting the preferred mode of implementation of a decoder according to the present invention. Assuming a graph defining the code comprising four nodes, the circuit, generally indicated as 50, comprises four identical integrated circuits 52 being one for each node. As shown, each integrated circuit 52 has an input line 54 connected thereto. Each digit is contained in a "smart register" 56 disposed in the line 54 between two node circuits 52. That is, the registers 56 include logic for changing the contents thereof according to preestablished rules. Data as received is initially stored in respective ones of the registers 56. To begin the decoding and error correcting procedure, each node circuit 52 performs its implemented algorithm on the data input from the lines 54 to the three registers 56 connected thereto. As a result of its calculations, each circuit 52 sends a suggested state for the contents of each register 56 on the associated line 54. Based on the two inputs to each register 56, each register 56 then decides what the next state of its contents should be. For example, one implementation might be that if either input line 54 desires to change the contents of the register 56, the contents are changed. The iterative procedure then begins once again.

It should be recognized by those skilled in the art that both the implementation of the many possible algorithms of the circuits defining the nodes 52 and the decision-making of the registers 56 are techniques well known to those skilled in the art and, of themselves, form no part of the present invention. Their combination in the implementation of encoding or decoding of a code as the electrical embodiment of a code defined by a bipartite graph is, however, unique. As will be recognized, to reconfigure to a different code requiring, for example, more nodes, more of the identical node circuits 52 and registers 56 need only be interconnected in a similar manner according to the definition of the new graph to create circuitry capable of handling the new code. No new algorithm performing circuitry need be designed or implemented. Thus, circuits implementing the present invention according to its preferred mode of implementation are completely flexible and, it is believed, will lead to the future development of a new family of apparatus for the implementation of error-correcting code transmission.

Thus, from the foregoing descriptions of my invention, it can be seen that the stated objectives thereof have been achieved to a high degree.

Wherefore, having thus described my invention, I claim:

1. In self-correcting date transmitting apparatus wherein a selected member of a family of codewords is transmitted, thereafter received in a modified state, and then interpreted at the receiving end as being the member closest in appearance to the modified codeword, the method of transmitting and correcting data comprising the steps of:

(a) establishing the family of codewords by (a1) selecting a connected bipartite undirected graph having a plurality of first nodes and a plurality of second nodes connected together by a plurality of edges and wherein none of said first nodes are connected to another of said first nodes and none of said second nodes are connected to another of said second nodes;

(a2) assigning a digit position for the codeword to each of said first nodes;

(a3) assigning subcode definitions to be associated with each of said first nodes;

(a4) assigning a set of values to be associated with selected ones of said second nodes such that as inputs to the ones of said first nodes connected to said selected ones of said second nodes said subcode definitions thereof are satisfied;

(a5) establishing said set of values from step (a4) in the digit sequence assigned in step (a2) as a member of the family of codewords; and, (a6) repeating steps (a4) and (a5) for different sets of values until the desired number of members of the family have been established;

(b) placing the digits of each codeword as received following transmission in individual storage registers connected as inputs to test nodes corresponding to said first nodes of said graphs;

(c) testing the contents of said storage registers as inputs against said subcode definitions associated with said first node;

(d) using the contents of said storage registers as the received codeword is all said subcode definitions are satisfied, otherwise continuing to step (e);

(e) using the contents of said storage registers as the received codeword if a preselected number of corrective iterations have been tried, otherwise continuing to step (f); and, (f) modifying the contents of at least one of said storage registers which is connected as an input to one of said nodes which has its associated subcode definition unsatisfied and returning to step (c).

2. The method of claim 1 wherein: p1 said subcode definitions are identical.

3. The method of claim 1 wherein:

said selected graph is one wherein the girth is approximately twice the diameter where the "diameter" is the maximum of the minimum length path connecting said nodes taken in pairs and the "girth" is the length of the shortest possible path for starting at one of said nodes, visiting distinct ones of said nodes, and returning to said starting node.

4. The method of caim 3 wherein:

said selected graph has a girth greater than four.

5. The method of claim 1 wherein:

(a) the digits as received and stored in said storage registers each have a probability figure associated therewith that the digit is the digit indicated; and, (b) said step (f) includes testing said probability figures and allowing the modification of only those digits having a probability below a preselected level.

6. The method of claim 1 wherein:

(a) the digits as received and stored in said storage registers each have a probability figure associated therewith that the digit is the digit indicated; and, (b) said step (f) includes calculating and storing new ones of said probability figures as a function of said modifications made to reflect the new true probabilities.

7. In self-correcting data transmitting apparatus wherein a selected member of a family of codewords is transmitted, thereafter received in a modified state, and then interpreted at the receiving end as being the member closest in appearance to the modified codeword, the improvement comprising:

(a) a plurality of storage registers for holding the digits of the codeword as received; and, (b) a plurality of test circuit means connected to each other and to selected ones of said storage registers for sensing the contents of said registers, for comparing said sensed contents as inputs with subcode definitions associated with each of said test circuit means and which subcode definitions are satisfied by all members of the family of codewords being transmitted, and for causing the contents of at least one of said storage registers connected to one of said test circuit means wherein said subcode definition is not satisfied to be changed to a value which more nearly compares to the compared subcode definition.

8. The improvement to self-correcting data transmitting apparatus of claim 7 wherein:

said plurality of test circuit means test for the same subcode definition.

9. The improvement to self-correcting data transmitting apparatus of claim 7 wherein said plurality of storage registers includes:

(a) means for receiving and maintaining a probability figure associated with each received digit of the codeword that the digit is the digit indicated; and, (b) means for allowing only ones of said storage registers to be changed wherein the probability associated therewith is below a threshold amount.

10. The improvement to self-correcting data transmitting apparatus of claim 7 wherein said plurality of storage registers includes:

(a) means for receiving and maintaining a probability figure associated with each received digit of the codeword that the digit is the digit indicated; and, (b) means for calculating new probabilities to be associated with each digit and for updating said stored probabilities as a function of modifications made to said stored digits to reflect the new true probabilities.

* * * * *